United States Patent
Barajas et al.

(10) Patent No.: US 7,171,897 B2
(45) Date of Patent: Feb. 6, 2007

(54) SYSTEM AND METHODS FOR DATA-DRIVEN CONTROL OF MANUFACTURING PROCESSES

(75) Inventors: Leandro G. Barajas, West Bloomfield, MI (US); Magnus B. Egerstedt, Atlanta, GA (US); Alex Goldstein, Atlanta, GA (US); Edward W. Kamen, Smyrna, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 99 days.

(21) Appl. No.: 10/836,155

(22) Filed: Apr. 30, 2004

(65) Prior Publication Data
US 2004/0244613 A1 Dec. 9, 2004

Related U.S. Application Data

(60) Provisional application No. 60/476,017, filed on Jun. 5, 2003.

(51) Int. Cl.
*B41M 1/12* (2006.01)
(52) U.S. Cl. ............... 101/129; 101/123; 101/126; 427/8
(58) Field of Classification Search ........ 101/123–130, 101/425; 427/8
See application file for complete search history.

(56) References Cited

U.S. PATENT DOCUMENTS

| | | | |
|---|---|---|---|
| 5,232,736 A * | 8/1993 | Tribbey et al. ............. | 427/8 |
| 5,309,837 A | 5/1994 | Nanzai ................. | 101/425 |
| 5,553,538 A * | 9/1996 | Freitag ................. | 101/123 |
| 5,709,905 A * | 1/1998 | Shaw et al. .............. | 427/8 |
| 5,751,910 A | 5/1998 | Bryant et al. ............ | 395/22 |
| 5,791,243 A | 8/1998 | Marcoux et al. ........... | 101/123 |
| 5,880,017 A | 3/1999 | Schwiebert et al. ........ | 438/613 |

(Continued)

OTHER PUBLICATIONS

Barajas, Leandro, "Process Control in High-Noise Environments Using a Limited Number of Measurements," Apr. 2003, School of Electrical and Computer Engineering Georgia Institute of Technology, 152 pages.

(Continued)

*Primary Examiner*—Minh Chau
(74) *Attorney, Agent, or Firm*—Thomas, Kayden, Horstemeyer & Risley LLP

(57) ABSTRACT

Systems and methods for implementing hybrid, closed-loop control that generates control values for processes defined by a limited number of function evaluations and large amounts of process and measurement noise. The described control system is applied to a stencil printing process for applying solder paste to an electronic medium such as a printed circuit board or semiconductor wafer. The control system is defined by a hybrid approach. A first, coarse algorithm is used to rapidly produce the value of a stencil printer control value resulting in a solder paste deposit having a volume within predetermined acceptable limits. After the coarse algorithm no longer produces solder paste deposits closer to a desired volume, a second, more refined estimator is used to fine tune the process. An additional transitional algorithm may be added between the coarse algorithm and refined estimator. The coarse algorithm may be implemented with a constrained-conjugated gradient search, and the refined search may be a implemented using a least-squares affine estimator or a quadratic estimator. The transitional algorithm may be implemented using a block version of a least-squares affine estimator.

43 Claims, 15 Drawing Sheets

U.S. PATENT DOCUMENTS

| | | | |
|---|---|---|---|
| 5,882,720 A | 3/1999 | Legault et al. | 427/8 |
| 5,988,856 A | 11/1999 | Braunstein et al. | 364/474.02 |
| 5,996,487 A | 12/1999 | Tomomatsu et al. | 101/123 |
| 6,171,399 B1 | 1/2001 | Kaiser et al. | 118/406 |
| 6,907,824 B2 * | 6/2005 | Yamasaki et al. | 101/129 |

OTHER PUBLICATIONS

Cheng, et al., "A Framework of an Intelligent Real-Time Decision Support System for Process Control in Electronics Assembly," 1997 IEEE, Department of Industrial Engineering, University of Houston, Department of Manufacturing System, North Carolina A&T State University, pp. 544-548.

Lau, et al., "A Hierarchical Evaluation of the Solder Paste Printing Process," May 1996, Department of Manufacturing Engineering, Hong Kong Polytechnic University, pp. 79-89.

Venkateswaran, et al., "A Realtime Process Control System for Solder Paste Stencil Printing," 1997 IEEE, Surface Mount Technology Laboratory, Universal Instruments Corporation, Binghamton, NY, pp. 62-67.

Kennedy, Jeff, "A Study of Solder Paste Printing Requirements for CSP Technology," 2000, Manufacturers' Services Ltd., Minnesota, USA, pp. 13-18.

Aravamudhan, et al., "A Study of Solder Paste Release from Small Stencil Apertures of Different Geometries with Constant Volumes," 2002 IEEE, Watson School of Engineering, NY, Cookson Electronics Equipment Group, MA, PP. 159-165.

Owczarek, et al., "A study of the off-contact screen printing process. II. Analysis of the model of the printing process," Components, Hybrids, and Manufacturing Technology, IEEE Transactions on, vol. 13, pp. 368-375, 1990.

Lofti, et al., "An Intelligent Closed-Loop Control of Solder Paste Stencil Printing," 1998 IEEE, Dept. of Mechanical and Manufacturing Engineering, Nottingham, England, pp. 87-91.

Feldmann, et al., "Closed Loop Quality Control in Printed Circuit Assembly," IEEE Transactions on Components, Hybrids and Manufacturing Technology, Part A. vol. 17. No. 2, Jun. 1994.

Durairaj, et al. "Correlation of Solder Paste Rheology with Computational Simulations of the Stencil Printing Process," Soldering & Surface Mount Technology, pp. 11-17, 2002.

Durairaj, et al., "Critical Factors Affecting Paste Flow During the Stencil Printing of Solder Paste," Jan. 2001, Soldering & Surface Mount Technology, pp. 30-34.

Pan, et al., "Critical Variables of Solder Paste Stencil Printing for Micro-BGA and Fine Pitch QFP," 1999 IEEE, Department of Industrial & Manufacturing Systems Engineering, PA, pp. 94-107.

Liu, et al., "Development of 0,5 and 0,65 MM Pitch QFP Technology in Surface Mounting," 1993 IEEE, The Swedish Institute of Production Engineering Research, pp. 52-62.

Zou, et al., "Fine Pitch Stencil Printing Using Enclosed Printing Systems," Oct. 2002, National Physical Laboratory, UK, Soldering & Surface Mount Technology, pp. 43-49.

Johnson, et al, "High Density/Fine Feature Solder Paste Printing," Speedline MPM, Cookson Performance Solutions, Apex, 2001, 8 pages.

Speedline Technologies, "Idle Time Recovery Ultraprint 3000 Series," Jan. 4, 1999, 6 pages.

Deblis, J., "Implementing Solid Solder Deposits (SSDs) in PCB Manufacture," Circuit World, 2001, Mack Technology, Inc., CA, pp. 10-13.

Sim, et al., "Maximizing Screen Printing Throughput," Surface Mount Technology, Electronics Engineer, Nov. 1999, 3 pages.

Barajas, et al., "On-Line Enhancement of the Stencil Printing Process," Circuits Assembly, Mar. 2001, pp. 32-36.

Rajkumar, et al., "Optimizing Process Parameters for Flip Chip Stencil Printing Using Taguchi's Method," 2000 IEEE, School of Aeronautical, Mechanical and Manufacturing Engineering, UK, pp. 382-388.

Okura, et al., "Optimization of Solder Paste Printability with Laser Inspection Technique," 1995 IEEE, PCB Engineering Dept., Computer and Network Systems Group, Japan, pp. 361-365.

Johnson, Alden, "Optimizing Stencil Printing for Fine-Pitch Circuit Boards," Electronics Engineer, Dec. 1997, MPM Corporation, 3 pages.

Alawani, et al., "Developing a Robust Stencil Printing Process for Diverse Interconnection Technologies," 2001, 14 pages.

Tonapi, et al., "Process 'Optimization' Using Designed Experiments in an EMS Provider's Facility," Dept. of Systems Science and Industrial Engineering, State University of NY, 8 pages.

Beair, Bill, "Real Time Statistical Process Control of the Screen Print Process," McKinney, 2001, Texas, 4 pages.

Sachs, et al., "Run by Run Process Control: Combining SPC and Feedback Control," IEEE Transactions on Semiconductor Manufacturing, vol. 8, No. 1, Feb. 1995, pp. 26-43.

Surface Mount Technology, User's Manual, Hitachi, Mar. 15, 2002, 94 pages.

Glinski, et al, "Simulation of the Stencil Printing Process," 2000 Int'l Symp. On Electronic Materials & Packaging, pp. 364-370.

Byle, F., "Using Industry DPMO Standards an In-Depth Look at IPC-9261 and IPC-7912," Rockwell Automation, 4 pages.

Houston, et al., "Analysis of Solder Paste Release in Fine Pitch Stencil Printing Processes," 14 pages.

Lathrop, R., "Solder Paste Print Qualification Using Laser Triangulation," IEEE Transactions on Components, Packaging and Manufacturing Technology, Part C, vol. 20, No. 3, Jul. 1997.

Ekere, et al., "Solder Paste Printing Process Modelling Map," Dept. of Aeronautical, Mechanical and Manufacturing Engineerimg, UK, 1995, pp. 137-141.

Bentzen, B., "Solder Paste Printing," Oct. 16, 2000, www.smtinfocus.com, pp. 1-5.

Mannan, et al., "Squeegee Deformation Study in the Stencil Printing of Solder Pastes," IEEE Transactions on Components, Packaging, and Manufacturing Technology, Part A. vol. 17, No. 3, Sep. 1994, pp. 470-476.

Morris, et al., "Stencil Printing of Solder Paste for Fine-Pitch Surface Mount Assembly," IEEE Transactions on Components, Hybrids, and Manufacturing Technology, vol. 14, No. 3, Sep. 1991, pp. 560-556.

Nguty, et al., "Understanding the Process Window for Printing Lead-Free Solder Pastes," 2000 Electronic Components and Technology Conference, pp. 1426-1435.

Bailey, et al., "Using Computer Models to Identify Optimal Conditions for Flip-Chip Assembly Reliability," Circuit World, 2001, pp. 14-20.

Stan, et al., "A Local Linearized Least Squares Algorithm for Training Feedforward Neural Networks," Brief Paper IEEE Transaction on Neural Networks, vol. 11, No. 2, Mar. 2000, pp. 487-495.

Onema, et al., "A Motion Planning Strategy and its Neural Network Implementations for an Articulated Two-Link Arm with Scissor Hand System," Abstract.

Westby, et al., "0201 Issue and Process Window," Sep. 2000, pp. -47.

Willis, "Follow Process Guidelines to Eliminate Printing Defects," Electronics Engineer, Aug. 1998, 3 pages.

Diepstraten, G., "5 Steps to Successful Lead-Free Soldering: Step 3," Circuits Assembly, Jun. 2001.

Diepstraten, G., "5 Steps to Lead-Free Soldering: Step 5," Circuits Assembly, Aug. 2001.

Kelley, et al., "A 3-D Solder Paste Inspection Strategy for CSPs and 0201s," 4 pages [Online document], Jan. 4, 1999, Available HTTP:// http://www.gsilumonics.com/electronics/pdfs/spi_3d.pdf.

Mignone, et al., "A Framework for Control, Fault Detection, State Estimation, and Verification of Hybrid Systems," Proceedings of the American Control Conference, San Diego, California, Jun. 1999, pp. 134-138.

Fierro, et al., "A Framework for Hybrid Control Design," IEEE Transactions on Systems, Man and Cybernetics, Part A: Systems and Humans, vol. 27, No. 6, Nov. 1997.

Chacon, et al., "A Framework to Implement Hierarchical Hybrid Control Systems and Industrial Complexes," 1996 IEEE, pp. 195-199.

Liberzon, D., "A Hybrid Control Framework for Systems with Quantization," 2001 IEEE, pp. 1217-1222.

Borges, J., "a Hybrid Systems Theory Framework for the Design of a Control Architecture for Multiple Autonomous Underwater Vehicles," ISIE 1997, pp. 747-752.
Ko, et al., "A Neural Network Approach to the Inspection of Ball Grid Array Solder Joints on Printed Circuit Boards," 2000 IEEE, pp. 233-238.
Han, et al., "A Printed Circuit Board Inspection System Using Artificial Neural Network," 1993 IEEE, pp. 238-242.
Halgamuge, et al., "A Rule Based Prototype Systems for Automatic Classification in Industrial Quality Control," 1993 IEEE, pp. 238-243.
Whalley, et al., "A Simplified Model of the Reflow Soldering Process," Soldering & Surface Mount Technology, 2002, pp. 30-37.
Han, et al., "A Printed Circuit Board Inspection System Using Artificial Neural Network," 1993 IEEE, pp. 238-242.
Tsai, et al., "A SMT Reflow Soldering Process Diagnosis System Using Neurofuzzy Approach," International Journal of Fuzzy Systems, vol. 3, No. 4, Dec. 2001, pp. 541-547.
Kashitani, et al., "A Solder Joint Inspection System for Surface Mounted Pin Grid Arrays," 1999 IEEE, pp. 1865-1870.
Chandrasekaran, et al., "A Stable and Efficient Algorithm for the Indefinite Linear Least-Squares Problem," 1998 Society for Industrial and Applied Mathematics, pp. 354-362.
Branicky, et al., "A Unified Framework for Hybrid Control: Model and Optimal Control Theory," IEEE Transactions for Automatic Control, vol. 43, No. 1, Jan. 1998, pp. 31-45.
Branicky, et al., "A Unified Framework for Hybrid Control," 1994 IEEE, pp. 4228-4234.
Barajas, et al., "Process Control in a High-Noise Environment Using a Limited Number of Measurements," 6 pages.
Howarth, et al., "Adaptive Fuzzy Control of Solder Paste Printing: The Identification of Deposit Defects," 1999 IEEE, pp. 102-107.
Ukata, et al., "An Algorithm for a Least-square Approximation Problem of Unknow Systems," 1991 IEEE, pp. 1881-1886.
Kim, et al., "An Automated Visual Inspection of Solder Joints Using 2D and 3D Features," 1996 IEEE, pp. 110-115.
Ogata, "An Automatic Solder Joint Visual Inspection System for Small Volume Production," 1997 PIMT/IMC Proceedings, pp. 317-320.
Kalukin, et al., "An Improved Method for Inspection of Solder Joints Using X-Ray Laminography and X-Ray Microtomography," 1996 IEEE, pp. 438-445.
Howarth, et al., "An Investigation into the Printing Characteristics and Mechanical Dynamics of Advanced Squeegee Mechanisms," 1999 IEEE, pp. 178-184.
Kamen, et al., "Analysis of Factors Affecting Component Placement Accuracy in SMT Electronics Assembly," 1998 IEEE, pp. 50-57.
Kamen, et al., "Analysis of Factors that Affect Yield in SMT Assembly," 8 pages.
Kankaran, et al., Automated Inspection of Solder Joints—A Neural Network Approach, 1995 IEEE, pp. 232-237.
Gunn, et al., "Selecting and Implementing Solder Paste Inspection for SMT Process Control," 2001, pp. 1-8.
Pierce, et al., "Automated Inspection of Through Hole Solder Joints Utilizing X-Ray Imaging," IEEE AES Systems Magazine, Feb. 1994, pp. 28-32.
Horng, et al., "Image Sequence Correspondence Vial Hopfield Neural Network," Abstract.
Jackson, et al., "Characterization of Lead-Free Solder Pastes for Low Cost Flip-Chop Bumping," 7 pages.
Nguty, T.A., "Correlating Solder Paste Composition with Stencil Printing Performance," IEEE 1999, pp. 304-312.
"Solder Paste Deposition Inspection: The First Step to Quality" Agilent Technologies, found at http://www.ate.agilent.com/emt/NEWS/OPTICAL/Solder_Paste_Deposit_Inspect.shtml, 3 pages.
Braithwaite, et al., "MDL: Advanced Electronic Packaging Techniques Enhance Function, Performance and Portability," MEM fall 1997, 5 pages.
Chin, et al., "Breakthrough Ball Attach Technology by Introducing Solder Paste Screen Printing," 2001 IEEE, 5 pages.
Ries, B., "Inspection Strategies for Process Control," Circuits Assembly—Process Control and Optimation, Mar. 2000.

Manessis, et al., "A characterization study of direct imaging technique for stencil printing of thick boards (0.125") in the alternative assembly and reflow technology (AART) or pin-in-paste process," presented at Electronics Manufacturing Technology Symposium, 1998.
Kulkarni, et al., "Convergence of the Robbins-Monro Algorithm Under Arbitrary Disturbances," 1993 IEEE, pp. 537-538.
Heikknen, et al., "Defect Diagnosis of Solder Joints Using Fuzzy Logic," 1996, pp. 502-509.
Mahajan, et al., "Defect Factors and Their Effects on PCB Assembly Yield—Statistical and Neural Network Predictive Models," 1993, pp. 353-361.
Morad, et al., "Development of an Intelligent System for the Solder Paste Printing Process," 2000 IEEE, pp. 479-483.
Specifications: DJ-2100 Dispensejet Valve, "Non-Contact Jetting Technology for Surface Mount Adhesive Applications," Asymtek.
Specifications: DV-7000 Series Pump, "Heli-Flow Pump" Asymtek.
Tyco Electronics brings to you: EKRA Stencil Printers, Tyco Electronics.
Shiu, et al., "Evaluation of Printed Circuit Board Assembly Manufacturing Systems Using Fuzzy Colored Petri Nets," 1998 IEEE, pp. 1506-1511.
Mukadam, et al., "Evaluation and Optimization of the Speedline MPM Closed-Loop Rheometric Pump Head," 9 pages.
Casteel, et al., "Evaluating Solder_Paste Defects," General Electric Co., 2 pages.
Brathwaite, N., "EMS Providers Must Take the Technology Lead," 7 pages.
Nguty, et al., "Evaluation of Process Parameters for Flip Chip Stencil Printing," 1998 IEEE, pp. 206-216.
Jackson, et al., "Experimental and Computational Modelling Characterization of Fine Particle Pb-Free Solder Paste Volumes for Flip Chip Assembly Applications," 2002 IEEE, pp. 304-309.
Anjard, R., Sr., "Factors Influencing the Quality of Solder Powder Used in Solder Pastes for Thick Film Circuits, Printed Circuitboards and Electronics Industry in General," Powder Technology, 36 (1983) pp. 189-202.
Houston, et al., "Failure Mode Analysis of Advanced Electronics Packaging," Georgia Institute of Technology, Session P-AP3, pp. 1-10.
Kloeser, et al., "Fine Pitch Stencil Printing of Sn/Pb and Lead Free Solders for Flip Chip Technology," 1998 IEEE, pp. 41-50.
Diepstraten, G., Five Steps to Successful Lead-Free Soldering: Step 2, Circuits Assembly, May 2001, pp. 52-58.
Diepstraten, G., "Five Steps to Successful Lead-Free Soldering: Step 4," Circuits Assembly, Jul. 2001, pp. 50-54.
Barbini, et al., "Five Steps to Successful Lead-Free Soldering," Circuits Assembly, Apr. 2001.
Suryanarayana, et al., "Flip-Chip Solder Bump Fatigue Life Enhanced by Polymer Encapsulation," IEEE, pp. 338-344.
Fujiuchi, S., "Fundamental Study on Solder Paste for Fine Pitch Soldering," 1991 IEEE, pp. 163-165.
Heikkinen, et al., "Fuzzy Classifier in Defect Diagnosis of Solder Joints," 1996 IEEE, pp. 113-117.
Xie, et al., Fuzzy Logic Models for Thermally Based Microelectronic Manufacturing Processes, IEEE Transactions on Semiconductor Manufacturing, vol. 8, No. 3, Aug. 1995, pp. 219-227.
Grilletto, et al., "Growth Prediction of Tin/Copper Intermetallics Formed Between 63/37 Sn/Pb and OSP Coated Copper Solder Pads for a Flip Clip Application," IEEE Transactions on Electronics Packaging Manufacturing, vol. 25, No. 2, Apr. 2002, pp. 78-83.
Painnaik, et al., "Guidelines for Fine Feature Stencil Printing," presented at SMTA International, Chicago, IL, 2001.
Kim, et al., "Heirarchical Process Control by Combining SPC and Soft Computing Methods," 2000 IEEE, pp. 485-489.
Liu, et al., "High Precision Solder Droplet Printing Technology and the State-of-the Art," Journal of Materials Processing Technology 115 (2001) pp. 271-283.
Ramkumar, et al., "High speed stencil printing of solder paste a DOE full factorial experiment," presented at SMTA International, Maui, Hawaii, 2000.

Barajas, et al., "Modeling and control of SMT manufacturing lines using hybrid dynamic systems," in Hybrid Systems: Computation and Control. Prague, The Czech Republic: Springer-Verlag, 2003.

Lavrov, A., "Hybrid Multi-Agent Framework for Real-Time Knowledge-Based Control," Intelligent Systems Engineering, Sep. 5-9, 1994, Conference Publication No. 395, IEE, 1994, pp. 354-359.

Sankaran, et al., "Improvements to X-Ray Laminography for Automated Inspection of Solder Joints," IEEE Transactions on Components, Packaging, and Manufacturing Technology—Part C, vol. 21, No. 2, Apr. 1998, pp. 148-154.

Neubauer, et al., "Improving X-Ray Inspection of Printed Circuit Boards by Integration of Neural Network Classifiers," 1993 IEEE, pp. 14-18.

Lotfi, et al., "Industrial application of fuzzy systems: Adaptive fuzzy control of solder paste stencil printing," *Information Sciences*, vol. 107, pp. 273-285, 1998.

Ugur, H.A., "Intelligent Modeling and Control of the Solder Paste Print Process for Surface Mount PCB Assembly," 1992, University of New York.

Neubauer, C., "Intelligent X-Ray Inspection for Quality Control of Solder Joints," IEEE Transactions on Components, Packaging, and Manufacturing Technology—Part C, vol. 20, No. 2, Apr. 1997, pp. 111-120.

Kloeser, et al., "Low Cost Bumping by Stencil Printing: Process Qualification for 200 um Pitch," 2000 Elsevier Science Ltd., pp. 497-505.

Sauer, et al., "Machine and Process Capability Coefficient of Solder Paste Printers," 2001 IEEE, pp. 26-31.

Pan, J., "Modeling and Process Optimization of Solder Paste Stencil Printing for Micro-BGA and Fine Pitch Surface Mount," Feb. 2000.

Gunning, et al., "Neural Network Based Classification Using Automatically Selected Feature Sets," Sublinn City University, Ireland, pp. 29-34.

Ho, et al., "Neural network modeling with confidence bounds: a case study on the solder paste deposition process," *Electronics Packaging Manufacturing, IEEE Transactions on [see also Components, Packaging and Manufacturing Technology, Part C: Manufacturing, IEEE Transactions on]*, vol. 24, pp. 323-332, 2001.

Wei, et al., "Noise-constrained least mean squares algorithm," *Signal Processing, IEEE Transactions on*, vol. 49, pp. 1961-1970, 2001.

Bemporad, et al., "Observability and Controllability of Piecewise Affine and Hybrid Systems," IEEE Transactions on Automatic Control, vol. 45, No. 10, Oct. 2000, pp. 1864-1876.

Forsgren, et al., "On Weighted Linear Leas-Squares Problems Related to Interior Methods for Convex Quadratic Programming," 2001 Society for Industrial and Applied Mathematics.

Dar, et al., "On-Line Inspection of Surface Mount Devices Using Vision and Infrared Sensors," 1994 IEEE, pp. 376-384.

Cassandras, et al., "Optimal Control of a Class of Hybrid Systems," IEEE Transactions on Automatic Control, vol. 46, No. 3, Mar. 2001.

Pepyne, D., "Optimal Control of Hybrid Systems in Manufacturing," IEEE, vol. 88, No. 7, Jul. 2000, pp. 1108-1123.

Presman, "Optimality Almost Surely and in Probability for a Stochastic Linearly Quadratic Regulator," Theory Probab. Appl., vol. 42, No. 3, pp. 531-536.

Yii, et al., "Optimization of a Solder Paste Printing Process Parameters Using a Hybrid Intelligent Approach," Dec. 6, 2000, pp. 109-128.

Yee, S., "Optimization of Design and Process Parameters for CSP Solder Joints," Reliability of Area Array Devices, Session P-AP9, Paper 2.

Hwang, J., "Soldering," Step-by-Step SMT. Pathways to SMT: Soldering, 6 pages.

Kumar, et al., "Optimizing Solder Paste Deposition for a High Volume—Low Mix SMT Line," 6 pages.

Jiang, et al., "Optimizing stencil printing parameters for organic materials," presented at Electronics Manufacturing Technology Symposium, 1997., Twenty-First IEEE/CPMT International, Micron Technol. Inc., Boise, ID, USA, 1997.

Lotfi, et al., "Orthogonal fuzzy model of the solder paste printing stage of surface mount technology," presented at Fuzzy Systems, 1997., Proceedings of the Sixth IEEE International Conference on, Dept. of Mech. & Manuf. Eng., Nottingham Trent Univ., UK, 1997.

Lotfi, et al., "Orthogonal Fuzzy Rule-Based Systems: Selection of Optimum Rules," Neural Computing and Applications, 2000, pp. 4-11.

Decarlo, et al., "Perspectives and Results on the Stability and Stabilizability of Hybrid Systems," 2000 IEEE, pp. 1069-1082.

Ezawa, et al., "Polymer Film Deposition with Fine Pitch Openings by Stencil Printing," Microelectronics Reliability, 43, 2003, pp. 473-479.

Heininger, N., "Polymer Stencils for Fine Pitch Applications," [Online document], May 25, 2002, Available HTTP:www.lpkfusa.com/articles/stencil/polymer_stencils.pdf.

D-Map 1-01 "Precision Control of Highly Viscous Fluids Using an ER3208," Tescom Corporation, Electronic Controls Division, Feb. 2001.

Ramkumar, et al., "Print Process Characterization for BGA, Fine Pitch BGA and CSP Components," 8 pages.

Sim, et al., "Printing: The Need for Speed, Accuracy and Efficiency," Electronics Engineer, Aug. 2000, 3 pages.

Yang, C., "Process Optimization for Surface Mount Printed Circuit Board Assembly," Dissertation, 1998.

Gopalakrishnan, et al., "Process Development for Ball Grid Array Assembly Using a Design of Experiment Approach," Int. Journal of Adv. Manuf. Technology, 1999, pp. 587-596.

Process Parameters Optimization for Mass Reflow of 0201 Components, Universal Instruments, Automation Electronic Assembly, 2000, 16 pages.

Haque, S., "Processing and Characterization of Device Solder Interconnection and Module Attachment for Power Electronics Modules," Dec. 1999.

Baldwin, et al., "Processing Strategies for High Speed 0201 Implementation," 8 pages.

Zhen, et al., "Quality improvement through SPC-DOE in SMT manufacturing," presented at Management of Innovation and Technology, 2000.. ICMIT 2000. Proceedings of the 2000 IEEE International Conference on, Sch. of Manage., Tianjin Univ., China, 2000.

Kolli, et al., "Rehological Characterization of Solder Pasts for Surface Mount Applications," IEEE Transactions on Components, Packaging, and Manufacturing Technology—Part B., vol. 20, No. 4, Nov. 1997, pp. 416-423.

Davison, et al., Roadmapping the PCB Assembly Future, Circuits Assembly, May 1999.

SE 200, "Sampled Solder Paste Inspection," Cyberoptics.

SE 300, 100% Solder Paste Inspection, Cyberoptics,

Mahajan, R. L., "Statistical neural network modeling for stencil printing," presented at Surface Mount International, 1996.

Barajas, "A Closed-Loop Control Algorithm for Stencil Printing," 8 pages.

W. E. Coleman, "Stencil print performance studies," presented at SMTA International, Chicago, IL, 2001.

Gamble, C., "What Does it Take to Successfully Implement AOI?," 5 pages.

Ramkumar, et al., "Print Process Characterization for BGA, Fine Pitch and CSP Components," 8 pages.

Byle, et al., "Solder Paste Printing Data Analysis: A Visual Approach," 5 pages.

Shaherwala, et al., "Qualification of 3-D Solder Paste Inspection Systems for Effective In-Line Process Control, " 9 pages.

Long, T., "Chip Scale Package Solder Paste Stencil Printing Optimization," ITT Aerospace Communications, 7 pages.

Pham-Van-Diep, et al., "Real Time Visualization and Prediction of Solder Paste Flow in the Circuit Board Print Operation," Cookson Electronics, Equipment Group, 9 pages.

X. Wu, F. Li, K. H. Tang, C.-P. Yeh, and K. Wyatt, "Solder joint design optimization for fine pitch component applications," presented at Thermal and Thermomechanical Phenomena in Electronic Systems, 1998, ITHERM '98. The Sixth Intersociety Conference on, Motolola Inc., Schaumburg, IL.

Ko, et al, "Solder Joints Inspection Using Neural Network and Fuzzy Rule-Based Classification Method," IEEE Transactions on Electronics Packaging Manufacturing, vol. 23, No. 2, Apr. 2000, pp. 93-103.

Ko et al., "Solder Joints Inspection Using Neural Network and Fuzzy Rule-Based Classification," 1998 IEEE, pp. 1565-1580.

Currie, et al., "Solder Paste Characteristics and Their Effect on Fine Pitch Printing," Factory 2000—Advance Factory Automation, 1994 IEE.

Donoghue, et al., "Solder Paste Displacement on Component Placement," 1992 IEEE, pp. 177-183.

Rocak, et al., "Solder Paste for Fine Line Printing in Hybrid Microelectronics," Microelectronics Journal, 26, 1995, pp. 441-447.

Peck, D. J., "Solder paste in SMT: a training perspective," presented at Electro 98. Professional Program Proceedings, Adv. Electron. Interconnect Inc., USA, 1998.

Burr, D., "Solder paste inspection: process control for defect reduction," presented at Test Conference, 1997. Proceedings., International, CyberOpt. Corp., USA, 1997.

K.-L. Lin and S. Yao, "Solder thickness variation with respect to soldering parameters," Components and Packaging Technologies, IEEE Transactions on [see also Components, Packaging and Manufacturing Technology, Part A: Packaging Technologies, IEEE Transactions on], vol. 23, pp. 661-664, 2000.

Antsaklis, P., Scanning the Issue/Technology, "Special Issue on Hybrid Systems: Theory and Applications a Brief Introduction to the Theory and Applications of Hybrid systems," Proceedings of the IEEE, vol. 88, No. 7, Jul. 2000.

Barajas, et al., "Stencil printing process modeling and control using statistical neural networks," *Submitted to IEEE Transactions on Control Systems Technology*, 2003.

Lin, et al., "Squeegee Bump Technology," IEEE Transactions on Components and Packaging Technologies, vol. 25, No. 1 Mar. 2002.

Schake, et al., "Stencil Design Improvement for Bumping Wafers by Printing Solder Paste," 9 pages.

Chen, et al., "Stochastic Linear Quadratic Regulators with Indefinite Control Weight Costs," 1998 Society for Industrial and Applied Mathematics.

Chen, et al., "Stochastic Linear Quadratic Regulators with Indefinite Control Weight Costs II," 2000 Society for Industrial and Applied Mathematics.

Johnson, et al., "Stencil Printing Basics: Equipment Materials and Process Requirements," Speedline Technologies, Inc., 2002, pp. 67-70.

Huang, et al., "Study of the Effect of Reflow Time and Temperature on Cu-Sn Intermetallic Compound Layer Reliability," Microelectronics reliability, 2002, pp. 1-6.

Koutsoukos, et al., "Supervisory Control of Hybrid Systems," Proceedings of the IEEE, vol. 88, No. 7, Jul. 2000, pp. 1026-1049.

Kumar, S., "Survey of various statistical process control methods," presented at Electronics Manufacturing Technology Symposium, 1991., Eleventh IEEE/CHMT International, Motorola Inc., Austin, TX, USA, 1991.

Industrial Electronics, "Clear Future for Fuzzy Logic MAP and CIM Advance CNC Takes to RISC X-ray Laminography Resolves 25 Micrometers," Technology 1991 IEEE, pp. 59-60.

Ekere, et al., "The Behavior of Solder Pastes in Stencil Printing with Vibrating Squeegee," IEEE Transactions on Components, Packaging and Manufacturing Technology—Part C, vol. 21, No. 4, Oct. 1998.

Ekere, et al., "The Influence of Wall Slip in the Measurement of Solder Paste Viscosity," IEEE Transactions on Components and Packaging Technologies, vol. 24, No. 3, Sep. 2001, pp. 468-473.

Nguty, et al., "The Rehological Properties of Solder and Solar Pastes and the Effect on Stencil Printing," Jul. 11, 2000.

Marin, et al., "Theoretical and Experimental Aspects n the Depositing Process of Solder and Adhesive Pastes in Surface Mount Technology," IEEE Polytronic 2002 Conference, pp. 150-154.

Crida, et al., "Using PCA to Model Shape for Process Control," Centre for Vision, Speech and Signal Processing, 1997 IEEE, pp. 318-325.

Brown, et al., "Utilization of Sensory Feedback During SMT Assembly," Florida Institute of Technology, pp. 349-352.

Jagannathan, et al., "Visual Inspection of Soldered Joints by Using Neural Networks," IEEE, pp. 7-12.

Ryu, et al., "Visual Inspection Scheme for Use in Optical Solder Joint Impressions," 1996 IEEE International Conference on Robotics and Automation, pp. 3259-3264.

Rautakoura, et al., "Web-based research of solder paste printing quality," presented at Electronic Materials and Packaging, 2001. EMAP 2001. Advances in, University of Vaasa, 2001.

Feldmann, et al., "Yield improvement in SMT production by integrated process monitoring and testing," presented at Electronic Manufacturing Technology Symposium, 1993, Fifteenth IEEE/CHMT International, Inst. for Manuf. Autom. & Production Syst., Erlangen Univ., Germany, 1993.

\* cited by examiner

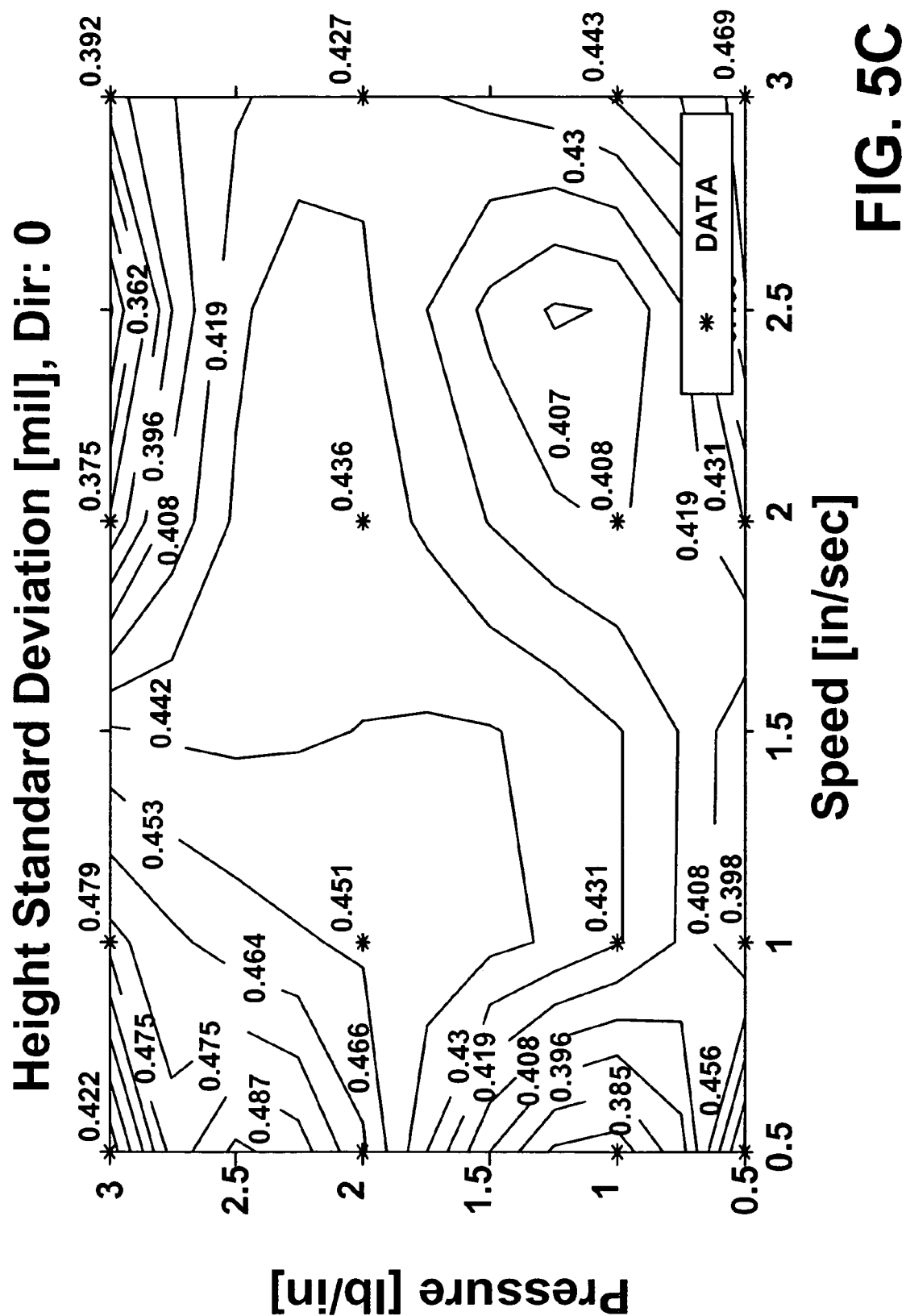

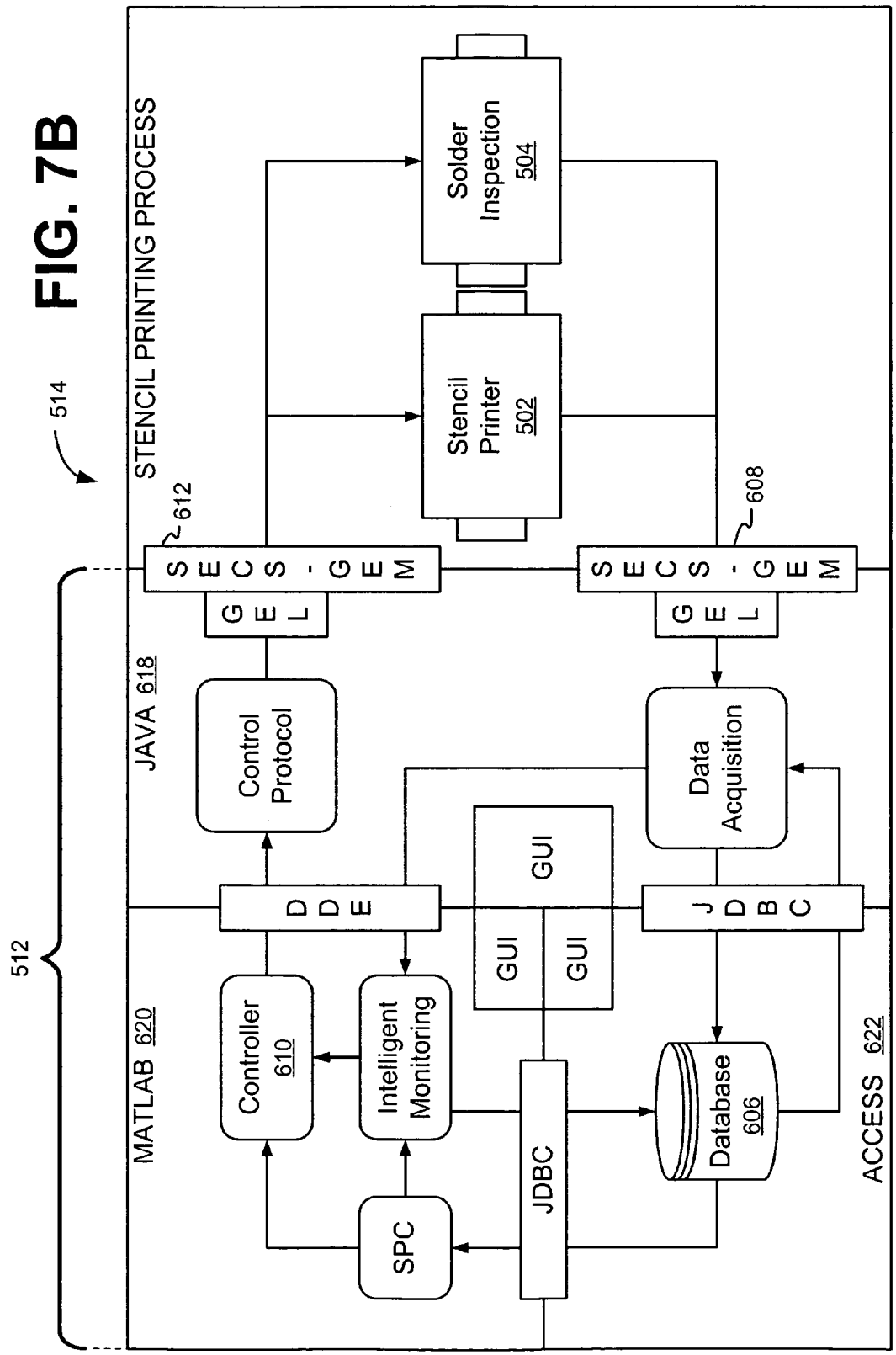

SYSTEM AND METHODS FOR DATA-DRIVEN CONTROL OF MANUFACTURING PROCESSES

CROSS REFERENCE TO RELATED APPLICATIONS

This application claims priority to U.S. provisional application entitled "Data Driven Control of Complex, High-Noise Manufacturing Processes," having Ser. No. 60/476,017, filed on Jun. 5, 2003, which is entirely incorporated by reference.

BACKGROUND

1. Field of the Invention

The present invention generally relates to systems and methods for a data-driven, closed-loop, hybrid control algorithm for a stencil printing process used in electronics manufacturing and semiconductor packaging.

2. Discussion of the Related Art

The stencil printing process is used in various electronics manufacturing environments. Generally, in relation to electronics manufacturing, stencil printing refers to the use of a stencil as a template for which solder paste or other similar material, including, but not limited to, polymer films, may be applied to an electronic medium such as a printed circuit board (PCB), a semiconductor device or a biological membrane.

The stencil printing process is widely used in surface mounting components to a PCB. Surface mounting, in contrast to thru-hole techniques, refers to a circuit board packaging technique in which the leads or pins on chips and other components are soldered on top of the PCB rather than through the circuit board. Both surface mounting and thru-hole techniques can be applied sequentially to the same PCB. In a typical surface mount PCB manufacturing process, the first step is to "print" solder paste deposits over the metallic contact pads of a PCB. The solder paste deposits are then verified, often by a mere visual inspection. The components are then placed on top of the solder paste deposits, pushing their leads into the paste. When the components have been attached, the solder paste is melted using either a reflow oven, vapor-phase soldering, or an equivalent technology to create the electro-mechanical junctures. Finally, the manufactured PCBs are inspected and tested.

The stencil printing process has also been adapted for use in the wafer bumping process. Wafer bumping is a packaging technology which uses solder bumps to form the interconnect between the integrated circuit (IC) and the package. Similar to the manufacture of PCBs, the process includes the deposition of solder onto each interconnect site.

No matter what use the stencil printing process is applied to, the process and the associated complications with controlling that process are shared. For example, the goal of the stencil printing process when manufacturing of PCBs, as well as when applying solder bumps in the wafer bumping process, is to apply an accurate and repeatable volume of solder paste deposits at precise locations on an electronic medium.

The stencil printing process is characterized by having high process and measurement noise levels and by requiring constant solder-paste-volume deposition at all times. This process has particular characteristics that make it extremely hard to control; some of the most relevant factors are: poorly understood process physics, difficulty in measuring key variables, a high-noise environment, a limited number of measurements, and software and hardware implementation limitations.

The ability to observe the stencil printing process is limited because key variables like solder paste viscosity and hydraulic pressure cannot be directly measured or estimated by most existing industrial production equipment. The process is furthermore corrupted by high degrees of noise caused by inaccuracies in the measurement and by internal system variability. Often, the inaccuracies in the measurement may be disregarded in the case when three-dimensional laser measurement techniques are used. However, the internal system variability has a six-sigma interval of approximately plus or minus thirty percent of the mean of the probability distribution function of the signal, making the process output extremely variable even under constant conditions.

Further, the associated cost of taking a measurement of a system output is high since it is necessary to actually print solder paste deposits on the electronic medium to take the measurements. It should be noted that the measurements are multivariate. The number of such outputs is related to the total number of solder paste deposits printed and inspected. This set of measurements as a whole is considered as a single realization of the system and it is desirable to minimize the number of such evaluations to be able to generate control values while printing as few unusable units as possible.

It has been estimated that between fifty to seventy percent of the total defects in PCB surface mount assembly lines are related to the stencil printing process, and that approximately thirty to fifty percent of the total manufacturing cost is due to test and rework expenses. Thus, the step of stencil printing is considered the most critical in the PCB manufacturing process. Furthermore, a defect that occurs in the early stages of the process will propagate, causing additional rework cost at each step in the process that the PCB goes through without being detected as defective. This stresses the importance of early detection of not only obvious printing errors (e.g., extreme lack or excess of solder paste in a solder brick), but also of possible causes of other defects resulting from degradation of solder paste quality, loss of the working viscosity point, or even machine-related failures. Thus, any attempt to enhance the performance of the PCB manufacturing lines often start with the stencil printing process.

Accordingly, because of the difficulty of controlling the stencil printing process due to the above described limitations, a control system and method of controlling the amount of solder paste deposited to an electronic medium is desired.

SUMMARY

Systems and methods are presented for implementing a hybrid, closed-loop control algorithm that generates control values for processes defined by a limited number of function evaluations and large amounts of process and measurement noise. The described control algorithm is used to control a stencil printing process to apply a desired volume of solder paste to an electronic medium such as a printed circuit board or semiconductor wafer. The control algorithm is defined by a hybrid approach using a first, coarse algorithm to achieve a solder paste volume within predetermined acceptable limits. Once operating within the desired limits, the control algorithm transitions to a more refined estimator for fine tuning the process.

One exemplary embodiment is a closed-loop control method for controlling a stencil printing process. The method includes measuring the height of a solder paste deposit on an electronic medium, and determining a value of a stencil printer control parameter based on the measured height of the solder paste deposit.

In another exemplary embodiment is a closed-loop control method for controlling a stencil printing process. The method includes determining a volume of a solder paste deposit on an electronic medium, and determining an updated value of a stencil printer control parameter based on the volume of the solder paste deposit.

Another exemplary embodiment is system for controlling a volume of a solder-paste deposit. The system includes a controller associated with a stencil printer operable to receive a measurement of the height of at least one solder paste deposit on an electronic medium. The controller also is operable to determine a control value of a stencil printer control parameter based on the measurement of the height of the at least one solder paste deposit.

Another exemplary embodiment is a system for controlling a volume of a solder-paste deposit comprising a controller associated with a stencil printer operable to receive a measurement of the volume of at least one solder paste deposit on an electronic medium. The controller is also operable to determine a control value of a stencil printer control parameter based on the measurement of the volume of the at least one solder paste deposit.

Another exemplary embodiment is a closed-loop control method of controlling a volume of solder paste applied to an electronic medium. The method includes incrementally adjusting a value of a stencil printer control parameter by a predetermined amount, and fine tuning the value of the stencil printer control parameter by a second variable amount once a mean solder paste deposit measurement is within predetermined process limits.

Another exemplary embodiment is directed to a closed-loop control method for controlling a stencil printing process. The method includes setting a first value of a stencil printer control parameter, measuring the height of a solder paste deposit on an electronic medium, and determining a second value of the stencil printer control parameter based on the measured height of the solder paste deposit.

Another exemplary embodiment is directed to a closed-loop control method for controlling a stencil printing process. The method includes setting a first value of a stencil printer control parameter, measuring the volume of a solder paste deposit on an electronic medium, and determining a second value of the stencil printer control parameter based on the measured volume of the solder paste deposit.

Other systems, methods, features and/or advantages will be or may become apparent to one with skill in the art upon examination of the following drawings and detailed description. It is intended that all such additional systems, methods, features, and/or advantages be included with this description and be protected by the accompanying claims.

BRIEF DESCRIPTION OF THE DRAWINGS

The accompanying drawings incorporated in, and forming a part of, the specification, illustrates several aspects of the hybrid control system, and together with the description serve to explain the principles of the invention. The components in the drawings are not necessarily to scale relative to each other. Like reference numerals designate corresponding parts throughout the several views.

FIGS. 5C and 5D depict contour plots of the standard deviation of the height and area, respectively, of a set of exemplary solder paste deposits plotted against a range of squeegee pressures and squeegee speeds.

FIG. 7B is a block diagram illustrating a more detailed view of another embodiment of the closed-loop control system shown in FIG. 6 using the disclosed systems and methods.

DETAILED DESCRIPTION

Several embodiments of a system that can be used for data-driven control of complex high-noise manufacturing processes will now be described in detail. While the embodiments of a hybrid, closed-loop control system will be described in connection with several figures, there is no intent to limit the system to the embodiment or embodiments disclosed therein. On the contrary, the intent is to cover all alternatives, modifications, and equivalents included within the spirit and scope of the invention as defined by the appended claims.

Controlling a Stencil Printing Process

Figure 1A:
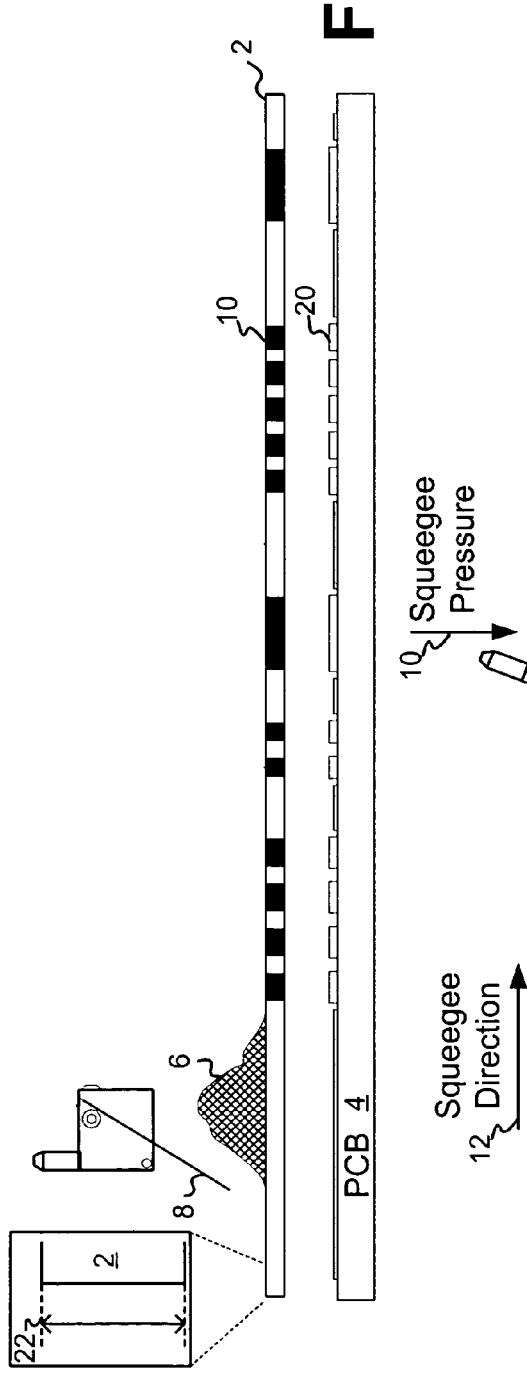
FIGS. 1A–1C depict several stages of the stencil printing process in which solder paste and surface mounted components are applied to a PCB.
Figure 1B:
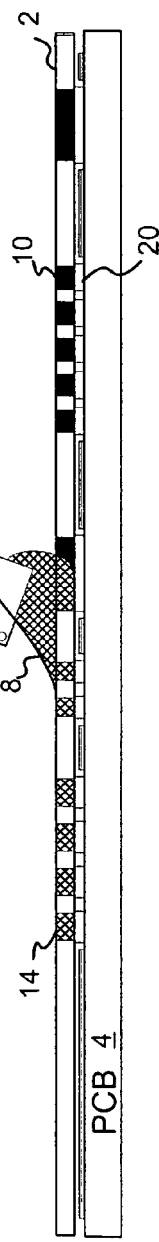
Figure 1C:
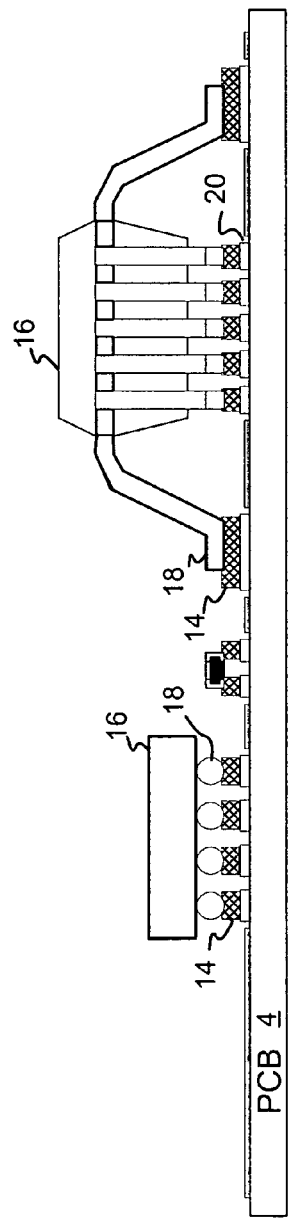

Referring now to the drawings, reference is made to FIGS. 1A–1C, which depict a PCB undergoing several phases of the stencil printing process. In FIG. 1A, a metallic stencil 2 is placed over a PCB 4 and solder paste 6 is kneaded onto one end of stencil 2. A squeegee 8 is positioned at the same end as solder paste 6. Because FIGS. 1A–1C are cut-out, side views, only a two-dimensional representation is made. However, it should be understood that stencil 2 is of some predetermined width, and that squeegee 8 and the solder paste 6 extend across at least a portion of the width of stencil 2.

As shown in FIG. 1B, squeegee 8 is drawn over stencil 2 in direction 12 with a specific pressure 10 and speed. This speed is known as the print speed or squeegee speed. This procedure causes the solder paste 6 to fill the apertures 10 of stencil 2. Subsequently, stencil 2 is separated from PCB 4 to reveal solder paste deposits 14. This separation is typically performed at a rate known as the snap-off speed. FIG. 1C depicts the resulting solder paste deposits 14 left behind after stencil 2 is removed. At this time, the leads 18 of the electronic components 16 are inserted into solder paste deposit 14. Note that, as shown in FIG. 1C, the solder paste deposits 14 may be of varying sizes depending on the type of the associated component 16.

The performance of the stencil printing process can heuristically be characterized by the physical properties of the printed solder paste deposits 14. Specifically, the industry standard for measuring the quality characteristics of the stencil printing process is solder-paste volume deposition. Accordingly, the stencil printing process objective is to apply a precise volume of each solder paste deposit to the medium. For PCBs, this precise volume of solder paste is applied to the locations where components are electrically connected to the PCB. These locations are known as PCB contact pads 20.

The solder paste deposits are sometimes known as a solder paste bricks due to the shape formed by the solder paste after being pressed through the apertures of the stencil. However, depending on a number of factors, such as shape of the stencil apertures 10, solder paste deposits may take a number of shapes. Knowing that the solder paste deposits may be of various shapes, and that solder paste volume is the measure of interest, determining the volume of a solder paste deposit in these various shapes can be accomplished in a number of well-known methods.

In the exemplary embodiments, for example, the deposits take the general form of bricks or cubes. Thus, the volume of the solder paste deposits may be estimated by measuring the width, height, and length of the solder paste deposit, with their product becoming the estimated volume.

Figure 2A:
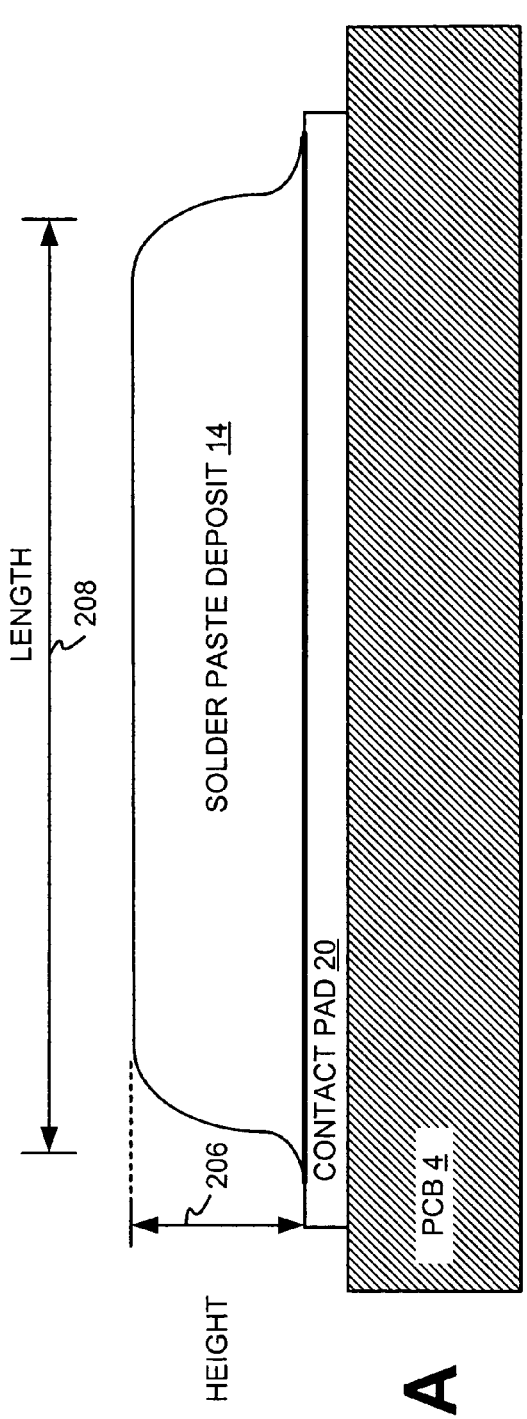
FIG. 2A is a close-up, side view of a solder paste deposit, such as one of the deposits shown in FIG. 1C, and a representation of the measurements taken for use in an embodiment of the hybrid, closed-loop control system.
Figure 2B:
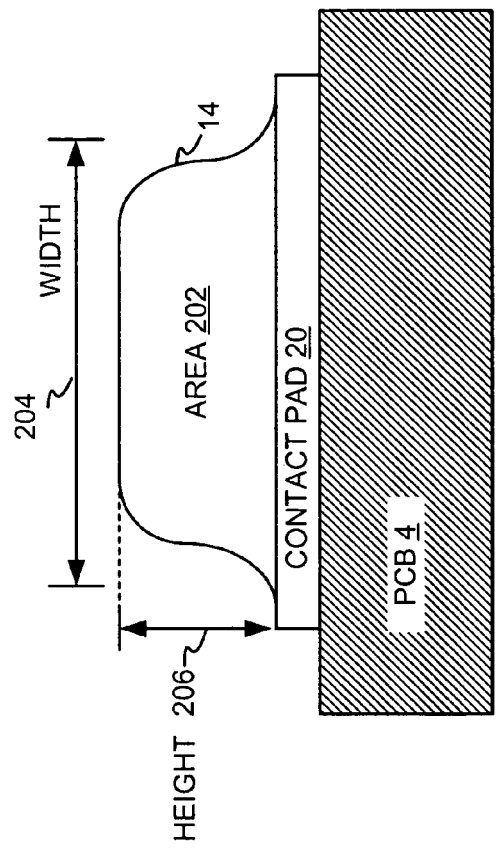
FIG. 2B is a close-up end view of the solder paste deposit depicted in FIG. 2A, depicting a further representation of the measurements taken for use in an embodiment of the hybrid, closed-loop control system.

Practically speaking, stencil 2 is constructed of a uniform or stepped thickness 22, and because the length and width of an individual solder paste deposit is given by the size of the aperture 10, a specific volume of solder paste is deposited on each pad 20. For example, FIGS. 2A–2B depict exemplary measurements of solder paste deposit 14. The length 208 and the width 204 of the solder paste deposit is largely determined by the corresponding length and width of the aperture used to form the solder paste deposit.

However, despite the fixed thickness 22 of stencil 2, the actual height 206 of the solder paste deposit varies depending on a variety of factors. Thus, measurement equipment is typically used to determine the actual height of the solder paste deposit. While the length and width may also be measured, in practice, it is assumed that these measurements correspond closely to the length and width of the aperture used to form the solder paste deposit to save additional effort. From these measurements, algorithms are used to estimate the effective area 202 using the width 204 and height 206 of the solder paste deposit. By multiplying this effective area 202 by the length 208, the product becomes the estimated volume.

Given that, under normal conditions, the length 208 and the width 204 of the solder paste deposits do not change significantly with the modification of the control parameters under normal conditions, the height 206 of the deposits become the measure of interest. Commonly, a direct sample mean of such values is used as quality characteristics, while a more sophisticated approach would be to assign different weight to each solder paste deposit type so that problematic components can be given more importance in the quality characteristics generation process. Such a weighted scheme can be represented by equation (1), where q is the number of solder paste deposits present in the $n^{th}$ board and $w_i$ is the weight assigned to the $i^{th}$ solder brick.

$$\overline{H}w(n) = \sum_{i=1}^{Q} w_i h(ni) \sum_{i=1}^{Q} w_i = 1, w_i \geq 0. \quad (\text{Eq. 1})$$

For steady-state performance evaluation the weighted mean-squared error between the mean weighted height $\overline{H}w(n)$ and the desired height $H_d$ in board-by-board basis can be used. This representation, as shown in equation (2), is appropriate since it addresses two of the key factors in the process, i.e., the mean squared error and the variance of the process.

$$MSE_w(n) = E[\overline{H}_W(n) - H_d)^2] = \underbrace{Var(\overline{H}w(n))}_{\text{AC ErrorTerm}} + \underbrace{(E[Hw(n)] - H_d)^2}_{\text{DC ErrorTerm}}. \quad (\text{Eq. 2})$$

Now that it is understood how to measure success of the process, attention is now directed to determining how to adjust the control parameters of the stencil printer to accomplish a desired solder deposit volume. A number of factors discovered to affect the solder-paste deposit volume, or its estimate, relate to six main areas: the stencil printer, the solder paste, the squeegee, the substrate, the environment, and the measurement tool.

Figure 3:
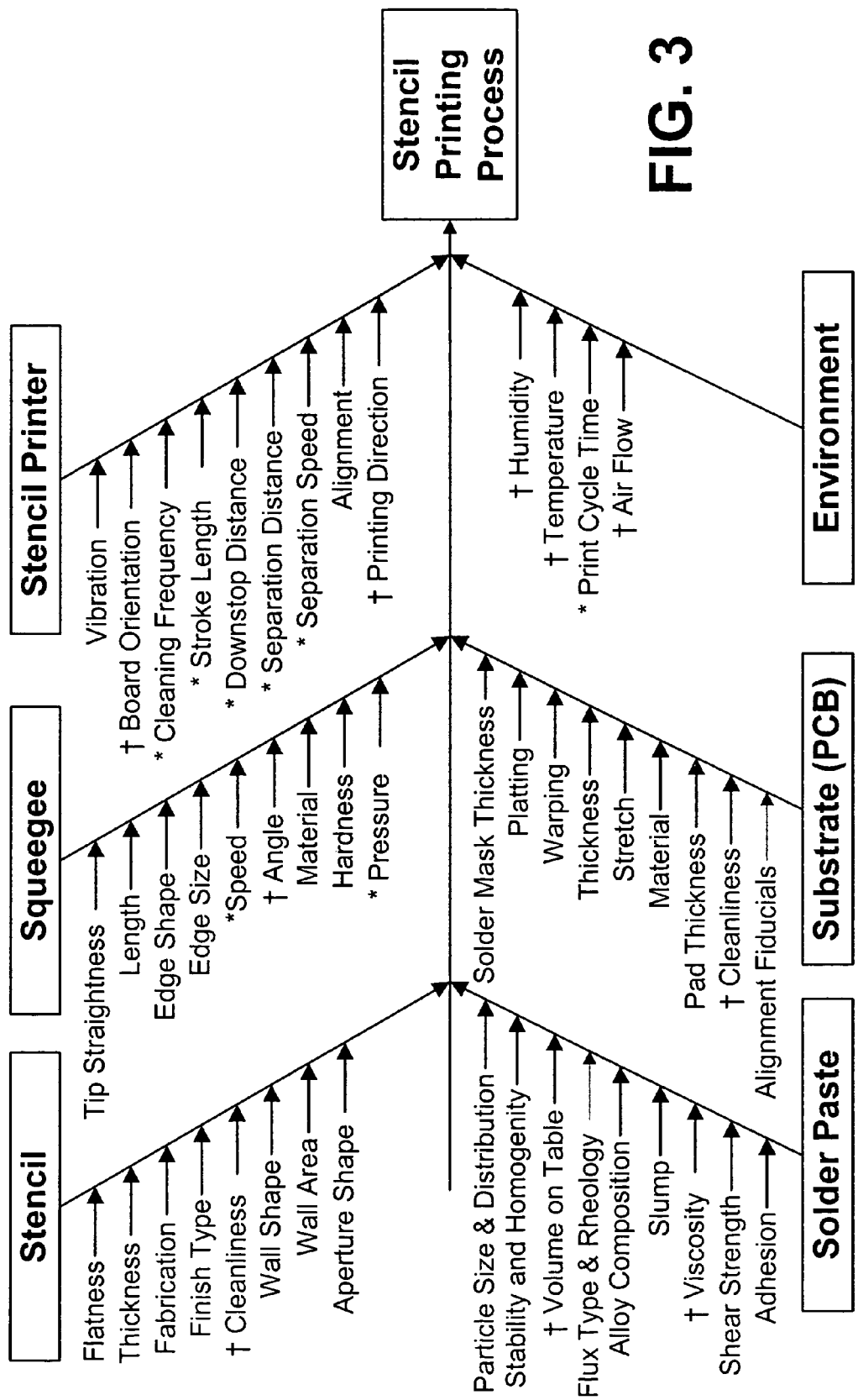
FIG. 3 represents several factors known to affect solder paste deposit volume in the stencil printing process.

These factors may be summarized by FIG. 3. Here, the main factors of the stencil printing process are classified in one of the six main categories and by their controllability and observability properties. The factors marked with a dagger (†) are directly or indirectly measurable, and are typically kept constant throughout the process. The factors marked with an asterisk (*) are factors which may be more easily used to dynamically control the stencil printing process. The remaining factors are typically static or may not be accessible during online optimization. FIG. 3 is not intended to include an exhaustive list of factors, but is merely representative of factors that may be considered.

In addition to the factors depicted in FIG. 3, the measurement tool's precision, accuracy, and speed plays a role in the overall accuracy of the process. A less precise or less accurate measurement tool may introduce more noise into the process.

From FIG. 3 it is clear that there are numerous factors that may be selected to control the solder paste deposit volume. For example, the speed and pressure of the squeegee, the cleaning frequency, the stroke length, the downstop distance, the separation distance, the separation speed, and the print cycle time make up a non-exhaustive list of factors which may be used to dynamically control the stencil printing process.

While all of the above factors may be used to control the stencil printing process using the embodiments described herein, certain factors are more desirable, from a practical standpoint, for use in controlling the process. For example, some factors are simply more easily accessible and easier to control than others. Additionally, the variance of some factors, while holding the other factors static, provide for a wider range of resulting solder paste volume than others.

Thus, the printing speed of the squeegee may be considered one of the more desirable factors for controlling the process. Controlling the speed, while holding squeegee pressure constant, allows for a wide range of resulting solder paste height values. Additionally, the squeegee speed is typically easily accessible and easy to change. Accordingly, while the exemplary embodiments below have used squeegee speed as the control value of choice it should be understood that any of the factors described above, and in FIG. 3, may be used to control the stencil printing process.

In the exemplary embodiments described herein, it should be understood that reference to a solder paste "height" inherently also corresponds to a solder paste deposit "volume" since the length and the width of the solder paste deposits do not change significantly with the modification of the stencil printer control parameters. Thus, while solder paste volume is ultimately the standard for measuring the quality characteristics of the stencil printing process, in some of the embodiments described herein this volume is capable of estimation by merely measuring the height of the solder paste deposits.

Figure 4A:
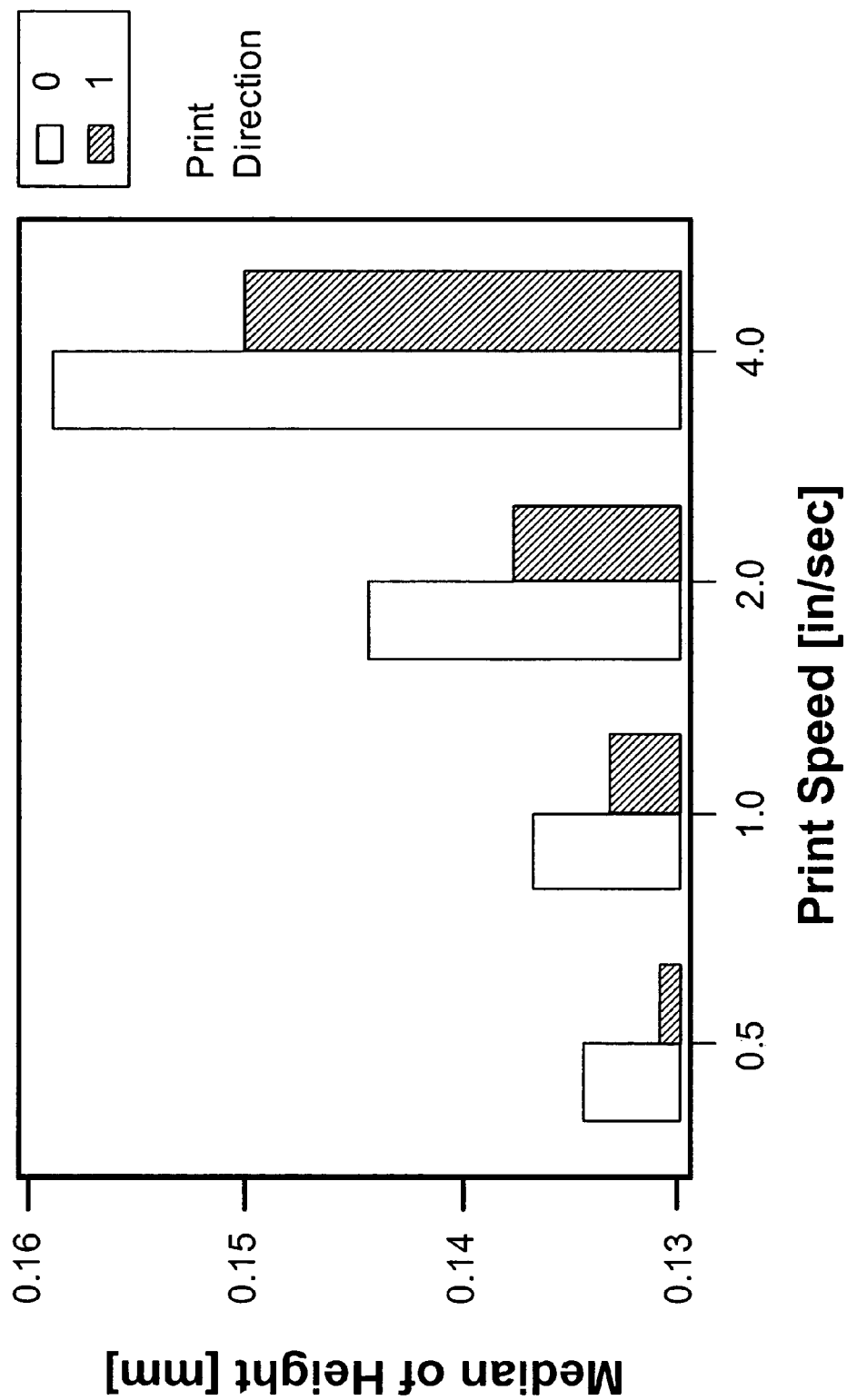
FIG. 4A is a chart illustrating the median height of an exemplary set of solder paste deposits when deposited at a set print speed and a predetermined squeegee pressure.

FIG. 4A depicts the relationship between the print speed control input and the mean height of the resulting solder paste deposit while holding the pressure constant at 1 lb/in. The chart in FIG. 4A should not be used to generalize the behavior of the controller, but rather should be recognized as one specific set of operational points. This specific case maintained a number of variables, such as squeegee pressure, as constant, while varying the squeegee speed from run to run. In some cases, if a different set of squeegee pressures is used, the resulting solder paste deposit height may actually decrease with an increase in print speed, for example. However, in this specific example, assuming the squeegee pressure is kept constant, the height of a resulting solder paste deposit generally increases as the speed of the squeegee is increased.

The print direction referenced in FIG. 4A represents a direction of the squeegee across the stencil. For example, looking back to FIG. 1B, the squeegee traverses across the stencil in a first direction 12. Direction 12 may be referenced as the "0" direction. For a subsequent PCB, the squeegee does not return to the position shown in FIG. 1A to begin. Rather, the squeegee starts at the opposite end of the stencil and traverses in the direction opposite of direction 12. This opposite direction may be referenced as the "1" direction. While a first and a second print direction are described herein for simplicity, a stencil printer may in fact print in any number of directions.

As indicated in the chart of FIG. 4A, the median solder paste deposit height may differ for a particular squeegee speed in each of the two print directions, 0 and 1. Thus, the feedback from each measured PCB may be used for every n+1 PCB because the results from printing in one direction are not necessarily applicable for use in predicting the behavior of the PCB printed in a different direction. Of course, in reality, there are some similarities that can be drawn since it is the same stencil printing machine using the same solder paste.

Figure 4B:
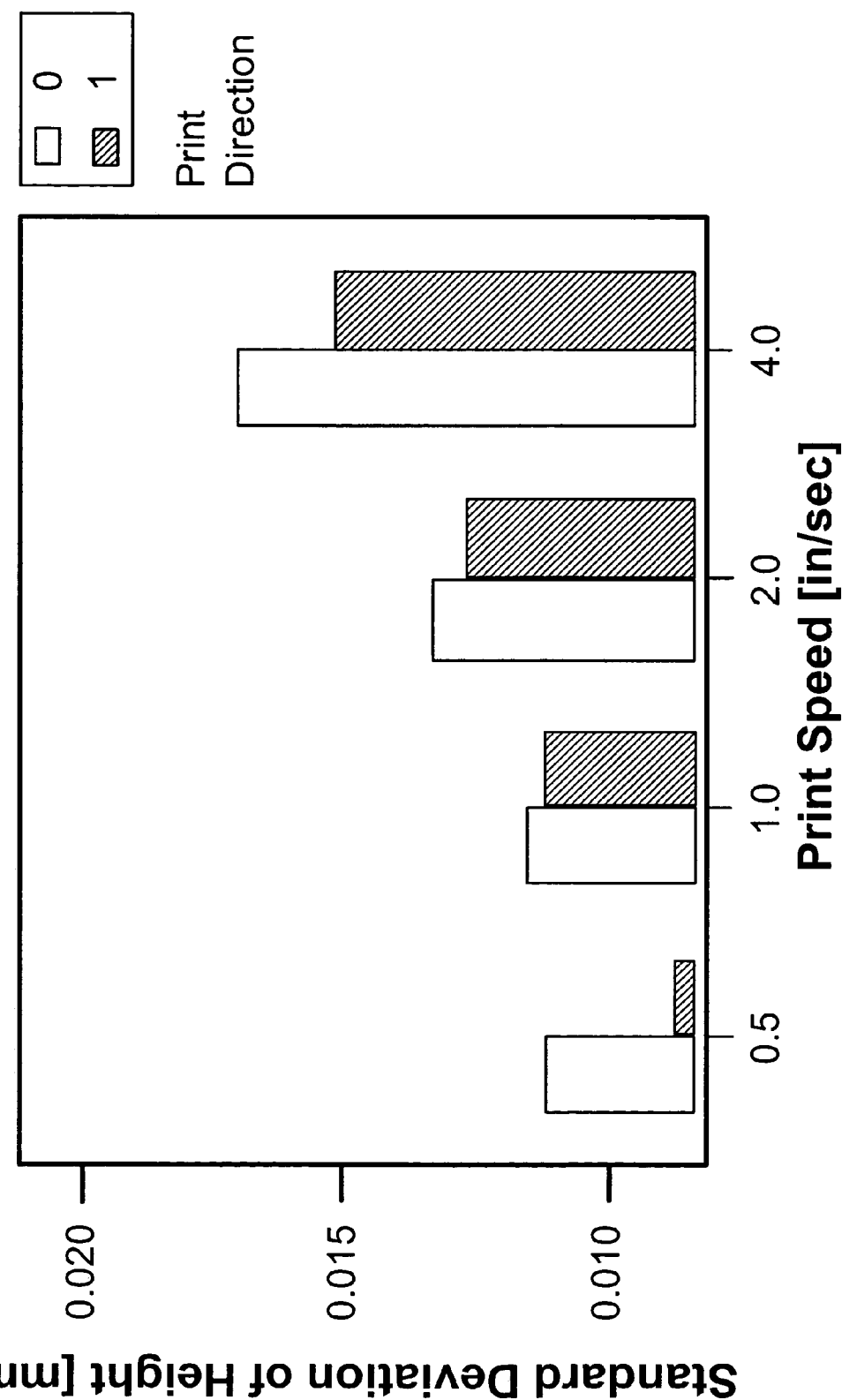
FIG. 4B is a chart illustrating the standard deviation of the height of an exemplary set of solder paste deposits when deposited at a particular print speed on a printed circuit board.

Looking now to FIG. 4B, a graphical representation of the relationship between the standard deviation of the mean solder paste deposit height as a function of the print speed of the squeegee is depicted. Note that the standard deviation and, thus, the degree of variability, also increases as the speed is increased and is different for each of the two print directions 0 and 1. FIG. 4B should also not be interpreted to generalize that in all cases an increase in speed results in an increase in variability. Rather, this is merely one example of the process variability known to occur with this specific set of operational points.

While general conclusions may not be made as to print speed and the resulting solder paste deposit height with respect to other speeds and squeegee pressures, FIGS. 4A and 4B are useful to illustrate at least two observations. First, the squeegee print direction may affect the resulting solder paste height significantly, even when other factors are kept constant. An additional conclusion is that squeegee speed may affect the variability of the process.

Figure 5A:
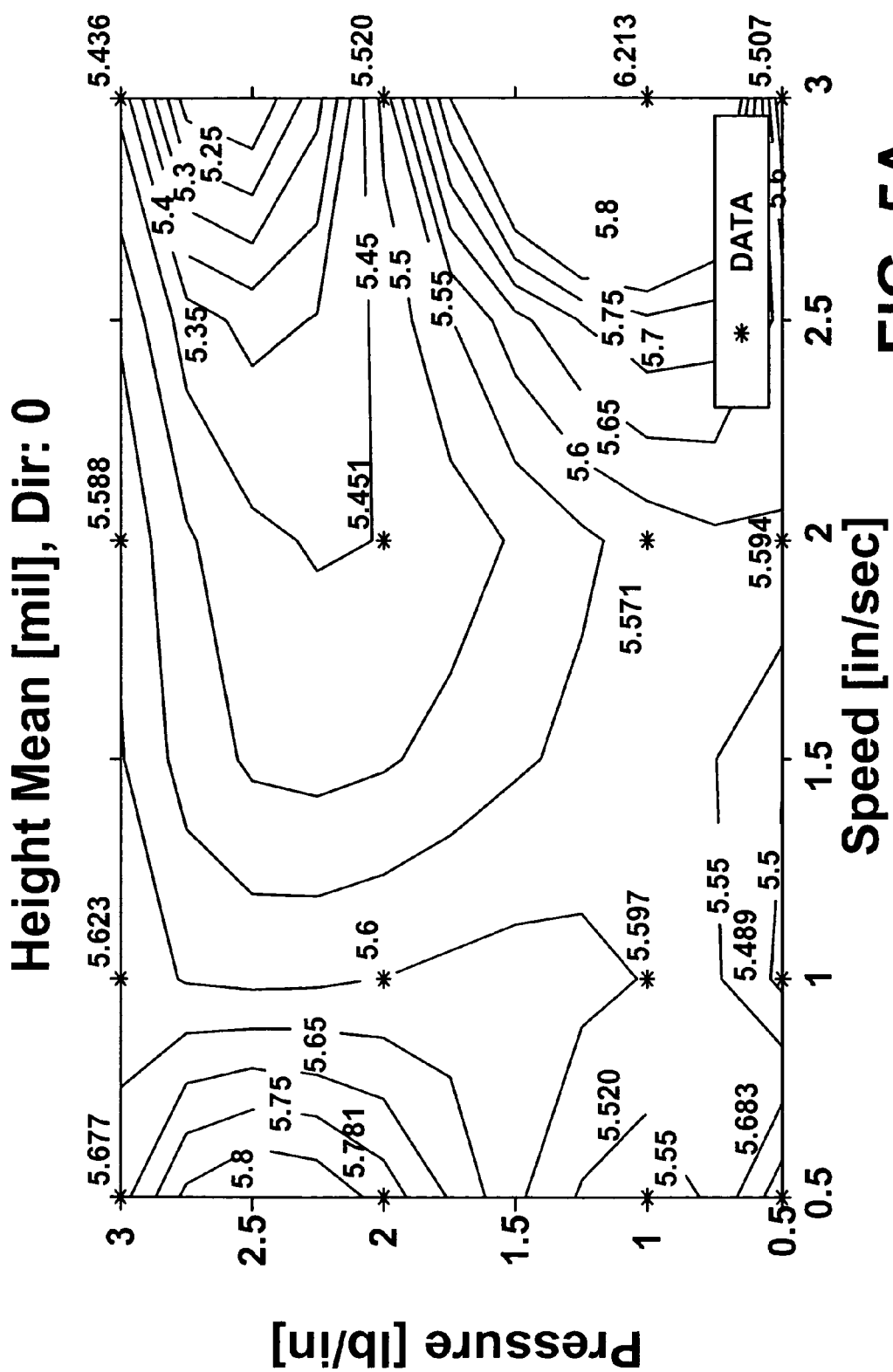
FIGS. 5A and 5B depict contour plots of mean height and area, respectively, of a set of exemplary solder paste deposits plotted against a range of squeegee pressures and squeegee speeds.
Figure 5B:
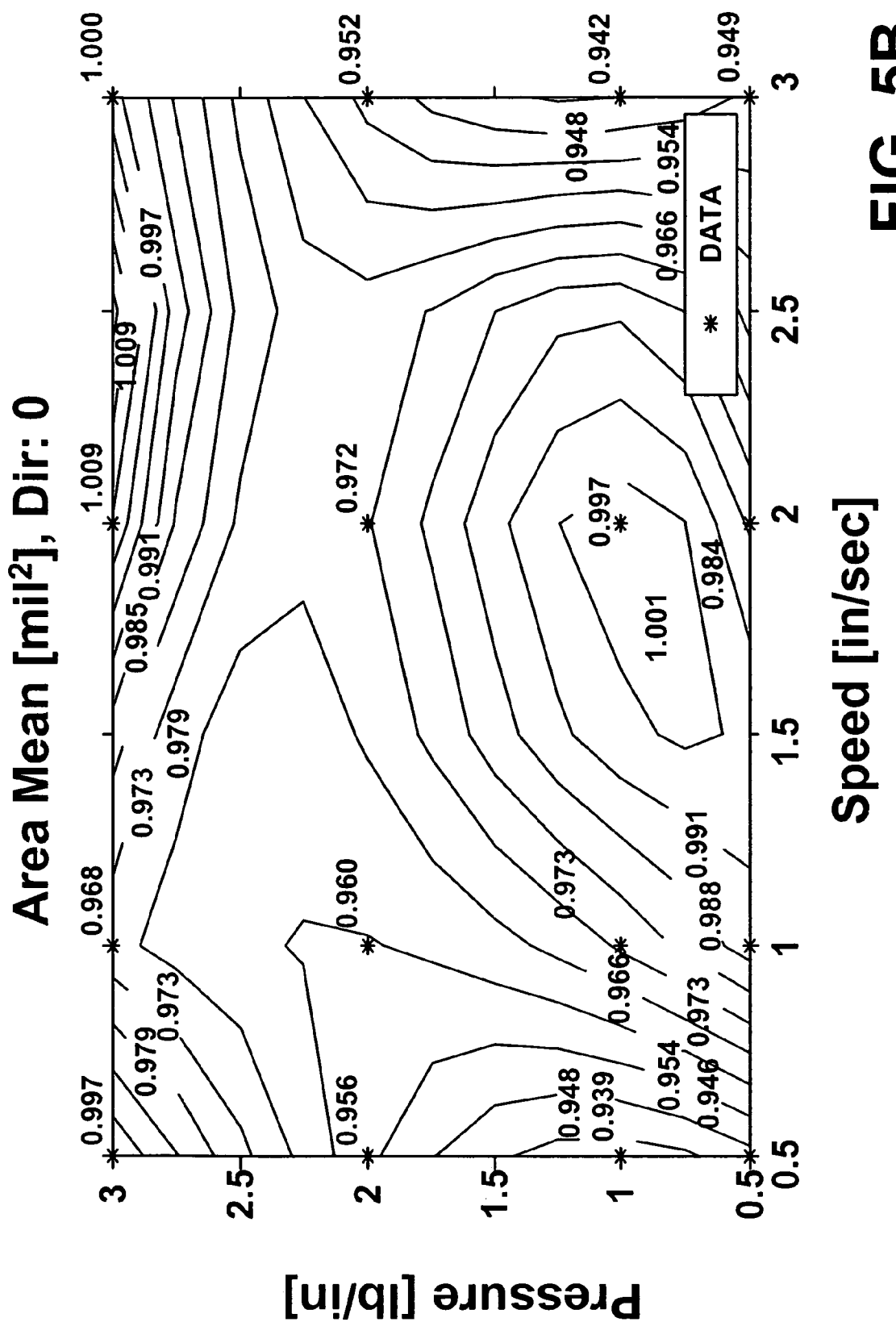
Figure 5D:
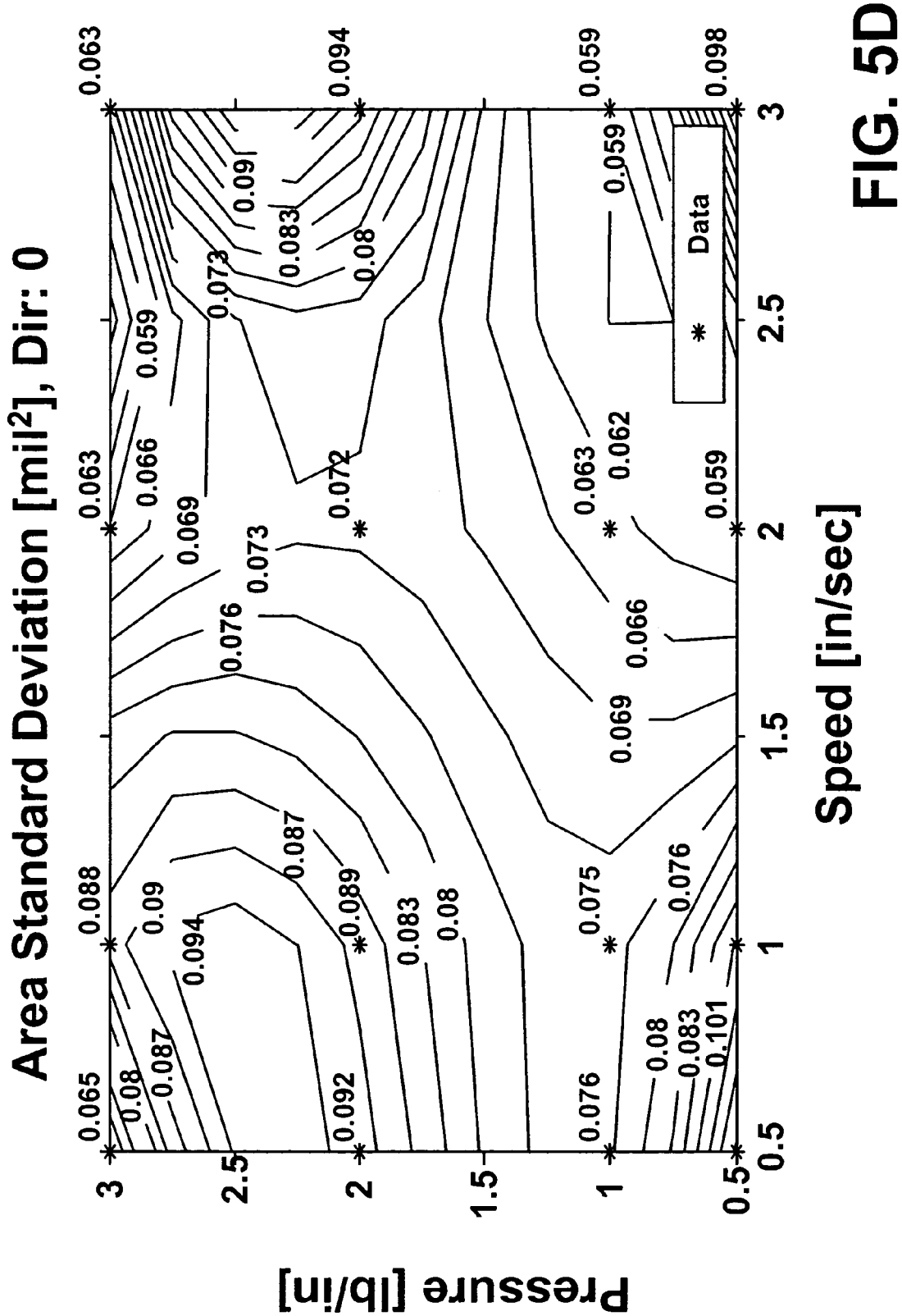

FIGS. 5A–5D further illustrate that FIGS. 4A and 4B should not be used to generalize the behavior of the controller for all pressures and speeds, and to further illustrate the complexity of the stencil printing process. FIGS. 5A and 5B depict contour plots of mean height and area, respectively, of a set of exemplary solder paste deposits plotted against a range of squeegee pressures (Y axis) and squeegee speeds (X axis). FIGS. 5C and 5D depict contour plots of the standard deviation of the height and area, respectively, of a set of exemplary solder paste deposits plotted against a range of squeegee pressures (Y axis) and squeegee speeds (X axis).

As shown in each of the contour plots of FIGS. 5A–5D, the behavior of the stencil printing process changes drastically for different operational points. Thus, while FIGS. 4A and 4B appear to suggest that the mean solder paste height always increases with an increase in squeegee speed, and that mean height variability always increases with an increase in speed, this conclusion is simply not true for all squeegee pressures. Rather, for example, an increase in squeegee speed may cause a decrease in solder paste deposit height, and/or a decrease in the mean solder paste height standard deviation.

Additionally, as shown in FIG. 3, other factors can greatly influence the output of the stencil printing process. Thus, contour plots created for solder paste deposits printed on the same stencil printer, but affected by any other factors known to affect the stencil printing process, such as print direction, may vary substantially from the plots seen in FIGS. 5A–5D.

In view of the characteristics of the solder printing process, the control system in the following embodiments may be used to estimate a squeegee speed that produces a solder paste deposit volume within process limits. Before describing the algorithms implemented within such a controller in detail it is helpful to describe the implementation of such a controller within the stencil printing process.

A Control System for the Stencil Printing Process

Figure 6:
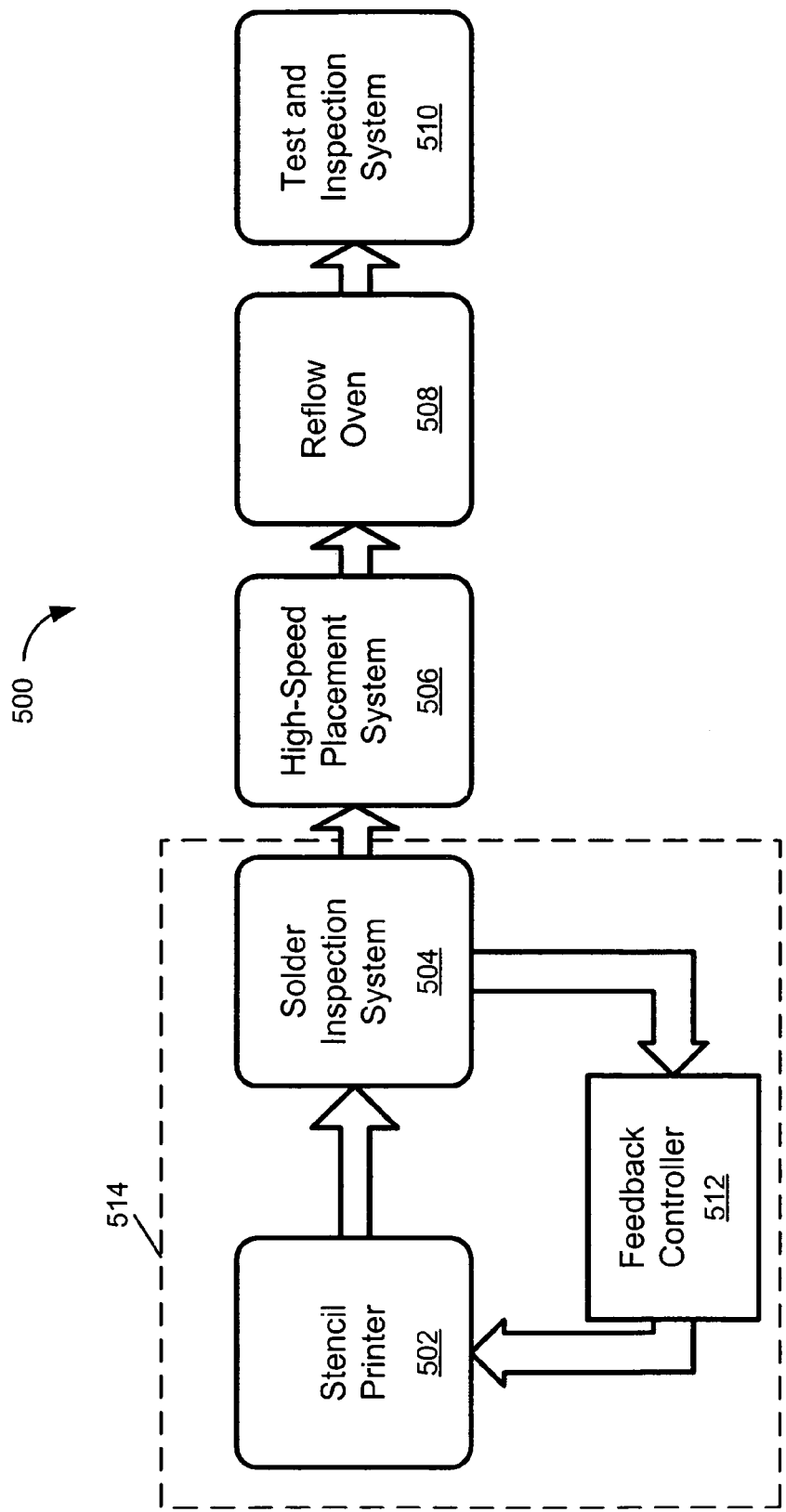
FIG. 6 depicts a functional block diagram of a simplified version of the PCB surface mount manufacturing process using the hybrid, closed-loop control system.

Now referring to FIG. 6, a block diagram of a stencil printing process 500 implementing an embodiment of the closed-loop, hybrid control system is described. The first step in the stencil printing process is to print solder paste deposits upon the PCB using stencil printer 502. For example, stencil printer 502 may be any one of several models offered by manufacturers of stencil printers including Speedline Technologies MPM, DEK International, and EKRA America, Inc.

The next step is to inspect the printed solder paste deposits with a measurement tool. This step is performed by solder inspection system 504 which may determine the physical measurements, such as the height, width, length, area, and/or volume of the solder paste deposits, for example. From this inspection, an operator is able to determine whether the appropriate volume of solder paste is applied to the PCB. By way of example, solder inspection system 504 may be a two-dimensional (2D), two-and-a-half-dimensional (2½D), or three dimensional (3D) laser inspection system, such as but not limited to, the SE 300 Solder Paste Inspection System manufactured by CyberOptics Corporation USA, or the SVS 8300SPI and SVS 8200SPI Solder Paste Inspection Systems manufactured by GSI Lumonics. New measurement technologies are being developed which may increase the accuracy of the volume measurements. For example, it is anticipated that solder inspection system 504 may also use Moiré Interferometry from Solvision, Inc. Moiré Interferometry technology employs laser triangulation to determine the volume of a solder paste deposit. Thus, while increased volume measurement accuracy is desirable, it should be understood that the embodiments of the described hybrid control system do not require a specific type of solder inspection system.

If the solder paste deposits are applied to the PCB within appropriate process limits, and no other defects are observed, then a high-speed placement machine 506 places the electrical components upon the solder paste deposits. With the components placed upon the solder paste deposits, the leads are pushed into the paste and the PCBs are passed to a reflow oven 508 which melts the solder paste to create the electro-mechanical junctures. In an alternative embodiment, instead of using reflow oven 508, it is also possible to use vapor phase soldering to create the electro-mechanical junctures. Finally, the manufactured PCBs are inspected and tested for proper functionality using test and inspection system 510.

According to the systems and methods described herein, a feedback controller 512 is integrated into stencil printing process 500. By using information gathered from solder inspection system 504, feedback controller 512 produces updated values of a stencil printer control parameter. An updated value of the stencil printer control parameter, herein also known as a "control value," is used by stencil printer 502 when printing subsequent solder paste deposits on an electronic medium. The control value, for example, may be squeegee speed or squeegee pressure, or any number of other factors mentioned in FIG. 3 that affect solder paste deposit volume.

In one embodiment, feedback controller 512 may communicate a new squeegee speed to stencil printer 502 based on dimension measurements of the solder paste deposits on the prior PCB, while keeping the squeegee pressure fixed. Stencil printer 502 prints solder paste deposits on subsequent PCBs using the updated squeegee speed. The combination of stencil printer 502, solder inspection system 504, and feedback controller 512 make up stencil printing system 514 which is now discussed in more detail.

Figure 7A:
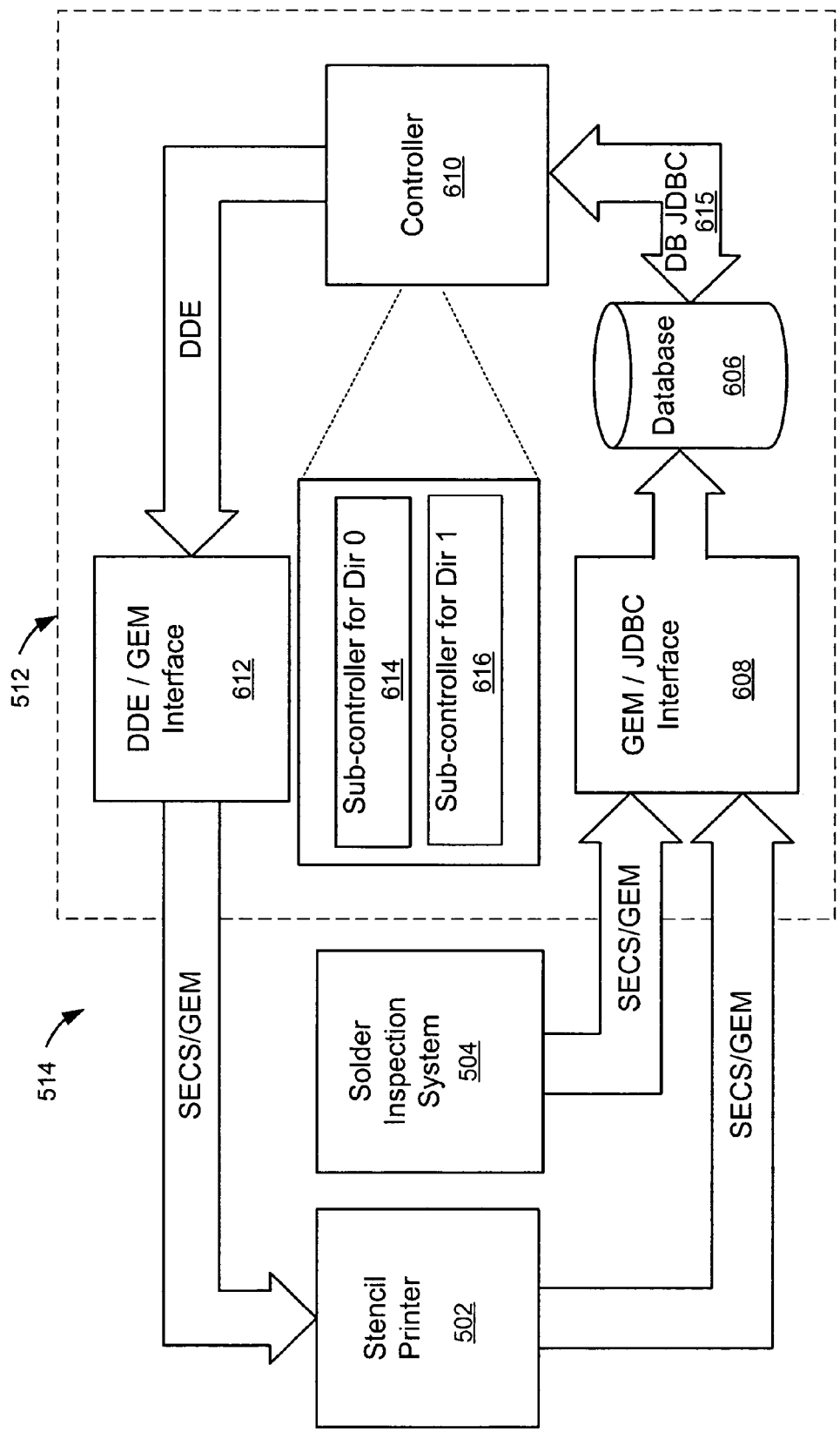
FIG. 7A is a block diagram illustrating a more detailed view of an embodiment of the closed-loop control system shown in FIG. 6 using the disclosed systems and methods.

FIG. 7A is an exemplary embodiment depicting a more detailed block diagram of the stencil printing system 514 introduced in FIG. 6. Stencil printer 502 and solder inspection system 504 are connected through a communications interface using the Semiconductor Equipment Communication Standard (SECS)/Generic Model For Communications And Control Of Manufacturing Equipment (GEM) protocol. As is known, SECS/GEM is used extensively in the semiconductor manufacturing field and is merely one bi-directional protocol for communicating information between manufacturing equipment or between equipment and a host controller. However, other types of communication protocols and communications mediums may be used. For example, rather than the typical RS-232 connection used with SECS/GEM, an Ethernet connection implementing HSMS, firewire, universal serial bus (USB), and a myriad of other connections, digital and analog, for transporting information between computing systems may be used.

The data sent from stencil printer 502 typically includes information relating to parameters with which a particular PCB is printed. For example, the data may include the actual and/or set squeegee speed and squeegee pressure. In addition, equipment alarms, errors, and any measured data such as solder paste temperature may also be collected. This information is sent with identification information such that the data can be associated with the printing of a particular PCB.

Much of the information collected from the stencil printer is static, and known. For example, the collected data may include the value of the set squeegee pressure that is in the process recipe. Even though these values typically do not change for a particular recipe, it is preferable to track this information in order to diagnose problems with the process which may be due to recipe settings that have been incorrectly entered or changed inadvertently on the stencil printer. Thus, tracking the values of stencil printer 502 parameters used to print solder paste on a particular PCB is valuable in diagnosing problems and ensuring stencil printing errors are minimized.

Solder inspection system 504, as discussed above in relation to FIG. 6, is may be any type of inspection system able to measure the height of the solder paste deposits. Inspection system 504 sends measured data through a SECS/GEM interface to GEM/JDBC interface 608. Solder inspection system 504 may also be configured to collect and report data such as alignment information. However, in relation to the control system of the present embodiment, the information of particular interest that is collected from inspection system 504 is the data used to obtain an estimate of the volume of the solder paste deposits. For example, inspection system 504 may report this as raw height, length, width, and/or area data. In an alternative embodiment, if inspection system 504 is capable of directly estimating the volume of the solder paste deposit, this estimated volume may be reported.

While not depicted in the diagram, solder inspection system 504 may be controlled through the SECS/GEM interface by the controller 512, or other computer systems. For example, the inspection system may be configured to accept commands to select a recipe, collect and transmit particular measurement information, begin the measurements, load and release the PCBs, etc. The SECS/GEM interface not only allows control of the equipment and the collection of data from the inspection and stencil printing machines, but the interface also allows the changing of numerous equipment variables which correspond to stencil printer control parameters. These control parameters may also be part of a machine recipe used to process a particular PCB.

The GEM/JDBC interface 608 receives the SECS/GEM messages sent from stencil printer 502 and inspection system 504. Java Database Connectivity (JDBC) refers to an application program interface (API) that provides an interface to database 606. Thus, GEM/JDBC interface 608 strips data from the SECS/GEM messages and stores the data into database 606. GEM/JDBC interface 608 may be configured to collect only specified information to conserve storage space on database 606.

Database 606 receives and stores the data sent from both stencil printer 502 and inspection system 504. For example, the data may include measurement information such as the area, height, width, and/or volume information from every solder paste deposit on the inspected boards, as well as the actual and set stencil printer control parameters (e.g. squeegee speed, squeegee pressure, temperature, etc.) used to print the solder paste deposits. This data can later be accessed directly by many different software applications such as Matlab, which may reside within controller 610. Nearly any commercially available database could be substituted with success. Database 606 may, for example, be a Microsoft Access database, an SQL database, a spreadsheet, or a simple flat text file. Database 606 is also interfaced with controller 610, and this interface would be dependent upon the type of database and the implementation of controller 610. For example, in the present embodiment, a DB JDBC interface 615 interfaces the controller 610 with database 606.

Controller 610 contains the software or circuitry to obtain the data stored in database 606 to calculate an updated control value for printing a subsequent PCB with stencil printer 602. The logic within controller 610 which implements the hybrid data-driven control schemes will be discussed extensively below. However, in summary, controller 610 requests and receives data from database 606 through DB JDBC interface 615, calculates at least one updated value of a stencil printer control parameter, and transmits this control value through the dynamic data exchange (DDE)/GEM interface to stencil printer 502. Additionally, controller 610 may be configured to send the calculated control information back to database 606 through DB JDBC interface 615 for permanent storage. It is anticipated that process engineers, for example, may which to access this type of historical information for additional process control, statistical analysis, or troubleshooting.

Controller 610 may contain an independent sub-controller for print direction "0" 614, as well as an independent sub-controller for print direction "1" 616. While the sub-controller for print direction "0" 614, as well as the sub-controller for print direction "1" 616 are depicted as being located within the same hardware or software component, it should be understood that they may be located on separate software programs or modules. The important aspect being that, preferably, each sub-controller 612 and 614 is operates independent of each other since print direction may account for a significant difference in the mean height of the solder paste deposits of any given board. Additionally, multiple independent controllers 610, each designated for a particular print direction, could be used to implement the control system.

DDE/GEM interface 612 receives the updated control values from controller 610, translates this control value into a SECS/GEM compliant data message, and forwards this message to stencil printer 502. Stencil printer 502 uses the updated control value for the stencil printing process on the subsequent PCB. For example, controller 610 may send an updated squeegee speed to stencil printer 502. Stencil printer 502, using software and circuitry well known in the industry, translates the received SECS/GEM message to extract the new squeegee speed, and then updates the corresponding system variable associated with the stencil printer control parameter. This system variable may correspond to an equipment recipe parameter. Stencil printer 502 is then configured to print a subsequent PCB using the updated squeegee speed. As discussed previously, a subsequent PCB may not be the next PCB printed on the stencil printer, but rather the next PCB printed in the same squeegee direction as the currently measured PCB.

After stencil printer 502 prints the subsequent PCB using the updated squeegee speed, process parameters are sent through the SECS/GEM interface to GEM/JDBC interface 608, and stored in database 606. The PCB is then placed on inspection system 504 which inspects and collects the solder paste deposit dimension information relating to the current PCB. This information is then delivered to database 606 and may be used by controller 610 to generate a new control value for printing a subsequent PCB.

A subsequent PCB may be printed on stencil printer 502 without waiting for the results from inspection tool 504. The drawback, of course, is that solder paste is deposited on the subsequent PCB without the benefit of control values calculated from measurements taken from the most recent PCB. Thus, the incident of rework may increase. However, in some environments, the added benefit of increasing throughput outweighs the cost of potential rework, particularly after controller 610 begins producing control values that result in solder paste deposit heights that are printed within acceptable process thresholds.

It should be understood that while the components within the feedback controller 512 are depicted as separate components, the GEM/JDBC interface 608, database 606, controller 610, and DDE/GEM interface 612 could all be incorporated into a single system, or could be spread apart across multiple components depending on system design and performance preferences. Additionally, stencil printer 502 and solder inspection system 504 may be integrated into a single piece of equipment which performs both functions.

Additional connectivity, systems, and related equipment may be incorporated into the stencil printing system 514. For example, in one embodiment, the feedback control system 512 may be integrated into an automated factory manufacturing system. In such a configuration, the control system may interact with the factory manufacturing system instead of with the equipment. In one such embodiment, the factory manufacturing system may control the operation of the equipment and perform the necessary data collection. The factory manufacturing system may then forward the required data to the feedback control system, receive an updated control value from the control system, and update the value of the stencil printer control parameter on the stencil printer with this value.

Additionally, the feedback control system 512 has been described as having the capability to update the squeegee speed of the stencil printer through transmissions to the stencil printer via the SECS/GEM interface. Other stencil printer control parameters, such as the squeegee pressure, snap off speed, stroke length, separation distance, and print direction may also be transmitted and updated on the stencil printer through the SECS/GEM interface, or other communications interfaces, in substantially the same manner, as well known in the art.

In yet another embodiment, controller 610 may not actually interface directly with the inspection equipment or stencil printer itself, but rather may be used as a standalone system. In such a system, the controller 610 may merely provide for manual input of feedback data, such as, but not limited to, solder paste deposit height, width, length, area, and/or volume information, squeegee speed, and squeegee pressure, etc. In one embodiment, this data may be input through a keyboard, mouse, or other user interface attached to the controller. Likewise, rather than automatically uploading the updated control value to the stencil printer through a communications interface, controller 610 may include an output device to communicate the control value to a user, such as through a computer monitor or other visual display. This control value may be used to manually update the value of the stencil printer control parameter. For example, a user may obtain the control value from the output device of controller 610 and adjust the corresponding control parameter on the stencil printer through, for example, switches, knobs, or more typically, a graphical user interface integrated into a computer system associated with the stencil printer.

FIG. 7B is yet another exemplary embodiment depicting a more detailed block diagram of the stencil printing system 514 introduced in FIG. 6. FIG. 7B is similar in many respects to the embodiment depicted in FIG. 7A, but includes further detail as to how the system described in 7A may be specifically implemented.

The exemplary embodiment of FIG. 7B decomposes the feedback control system 512 into three components: an communication portion 618, a control portion 620, and a database portion 622.

Communication portion 618, may be implemented using Java interface. As is widely known, Java is a general purpose, high-level, object-oriented, cross-platform programming language The Java interface is used provide the bi-directional communications interface between the feedback control system 512, and stencil printer 502 and inspection system 504. One advantage of using Java, is the ability to implement the complete control of the stencil printer from any other remote application that supports DDE capability. Thus, applications such as Matlab, which has a DDE interface, could be interfaced to the stencil printer and inspection tool via Java. Additionally, a GEL library is encapsulated within the Java interface to provide the basic SECS/GEM capabilities.

Control portion 620 may be implemented through a Matlab statistical software available from The MathWorks, Inc., Natick, Mass. Control portion 620 may include the controller 610, any additional statistical process control (SPC) algorithms, and intelligent monitoring systems. Control portion 620 may be adapted to host a number of control algorithms without major modifications, while maintaining communications with database portion 622 and communication portion 618.

Database portion 622 includes database 606 as described above, and may be implemented through a Microsoft Access database which is interfaced with the communication portion and the control portion by a JDBC interface. Database portion 622 may also perform some basic SPC operations.

All three portions may have an integrated graphical user interface (GUI) for user interaction, and as described above, may be implemented on one computer system, or spread across any number of computer systems.

Attention is now directed to several embodiments of the hybrid control algorithm executed by the software or hardware circuitry of controller 610 of FIG. 7A or 7B to control the solder paste deposit volume. In this regard, such a hybrid control algorithm can be implemented in software, firmware, hardware, or combinations thereof.

When implemented in hardware, such a hybrid control algorithm can be implemented with one or a combination of various technologies. By way of example, the following technologies, which are each well known in the art, can be used: a discrete logic circuit(s) having logic gates for implementing logic functions upon data signals, an application specific integrated circuit(s) (ASIC) having appropriate combinational logic gates, a programmable gate array(s) (PGA), and a field programmable gate array(s) (FPGA). In alternative embodiments, a hybrid control algorithm can be implemented in software as an executable program(s). Such a hybrid control algorithm can be executed by a computer or processor-based device.

Generally, in terms of hardware architecture, controller 610 includes a processor, memory, and one or more input and/or output (I/O) devices that are communicatively coupled via a local interface. The memory includes one or more separate programs, each of which comprises an ordered listing of executable instructions for implementing logical functions. In the example of FIG. 6, the memory within controller 610 includes an operating system (O/S) and a software executing a separate hybrid control algorithm for each print direction.

When the hybrid control algorithm is implemented in software, it should be noted that the hybrid control algorithm can be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. In the context of this document, a "computer-readable medium" can be any means that can store, communicate, propagate, or transport the program for use by or in connection with the instruction execution system, apparatus, or device. A computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 8:
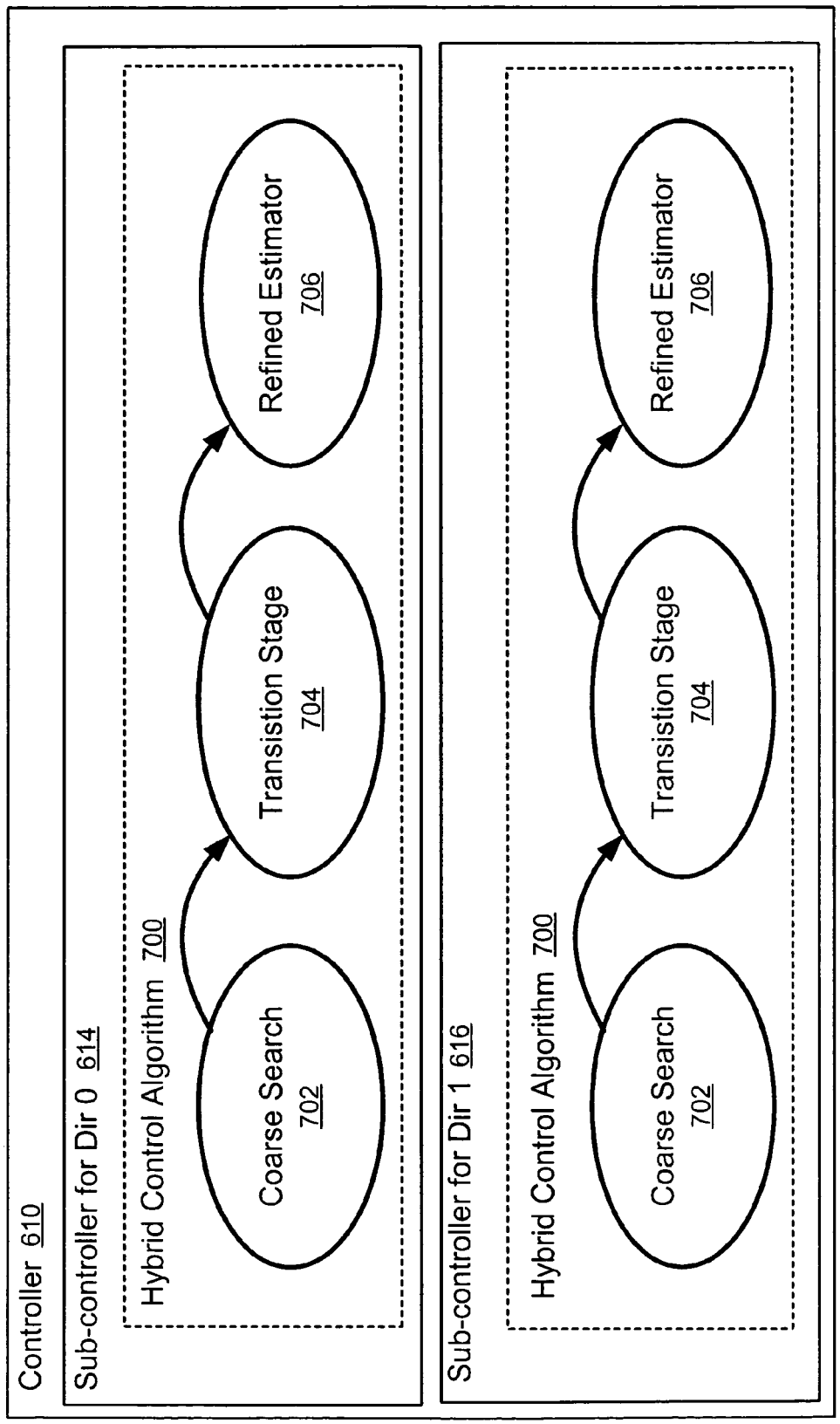
FIG. 8 is a state diagram of an embodiment of the described hybrid control system that may be implemented within the controller of FIGS. 7A and 7B.
Figure 9:
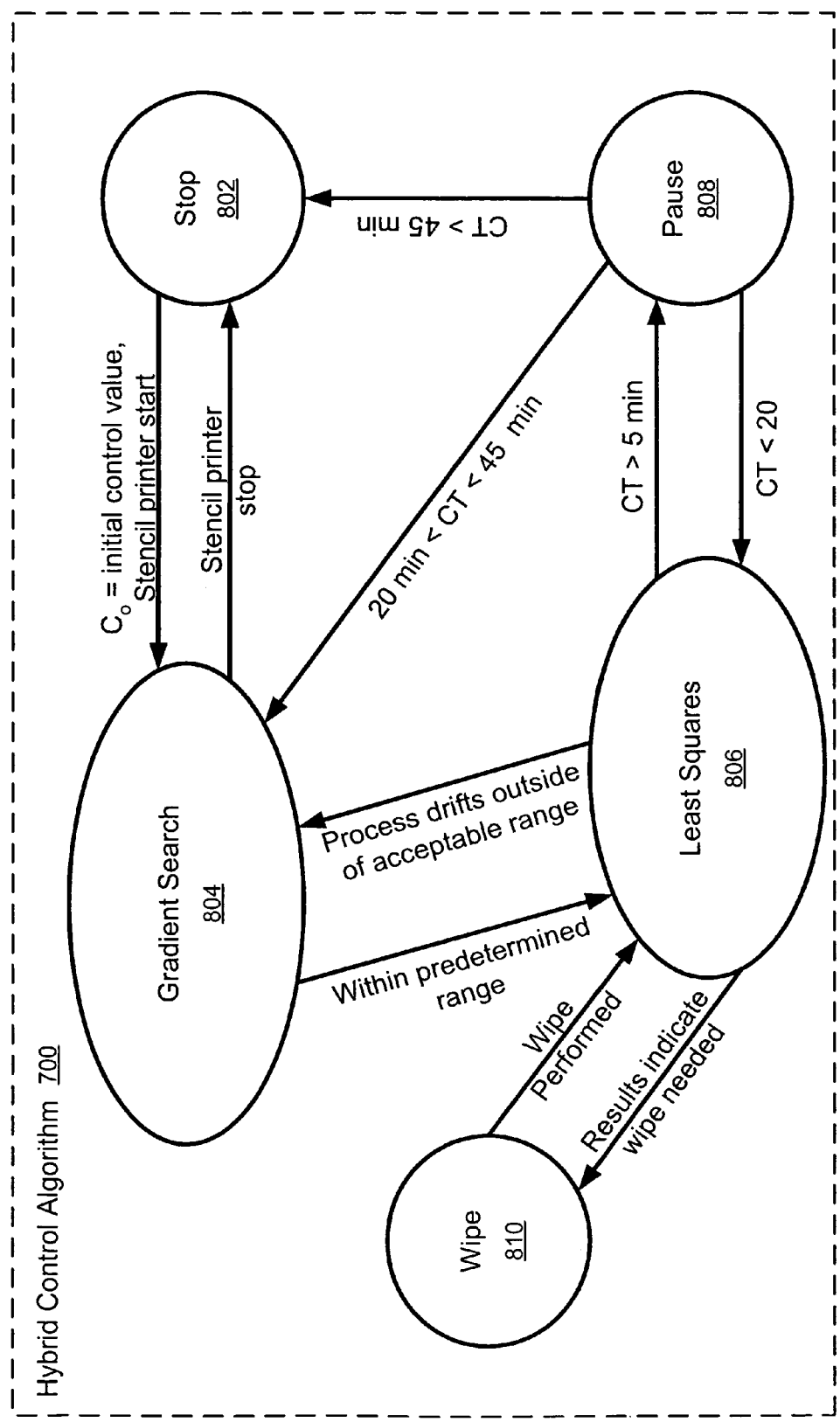
FIG. 9 is a more detailed state diagram of an embodiment of the described hybrid control system that may be implemented within the controller of FIGS. 7A and 7B.
Figure 10:
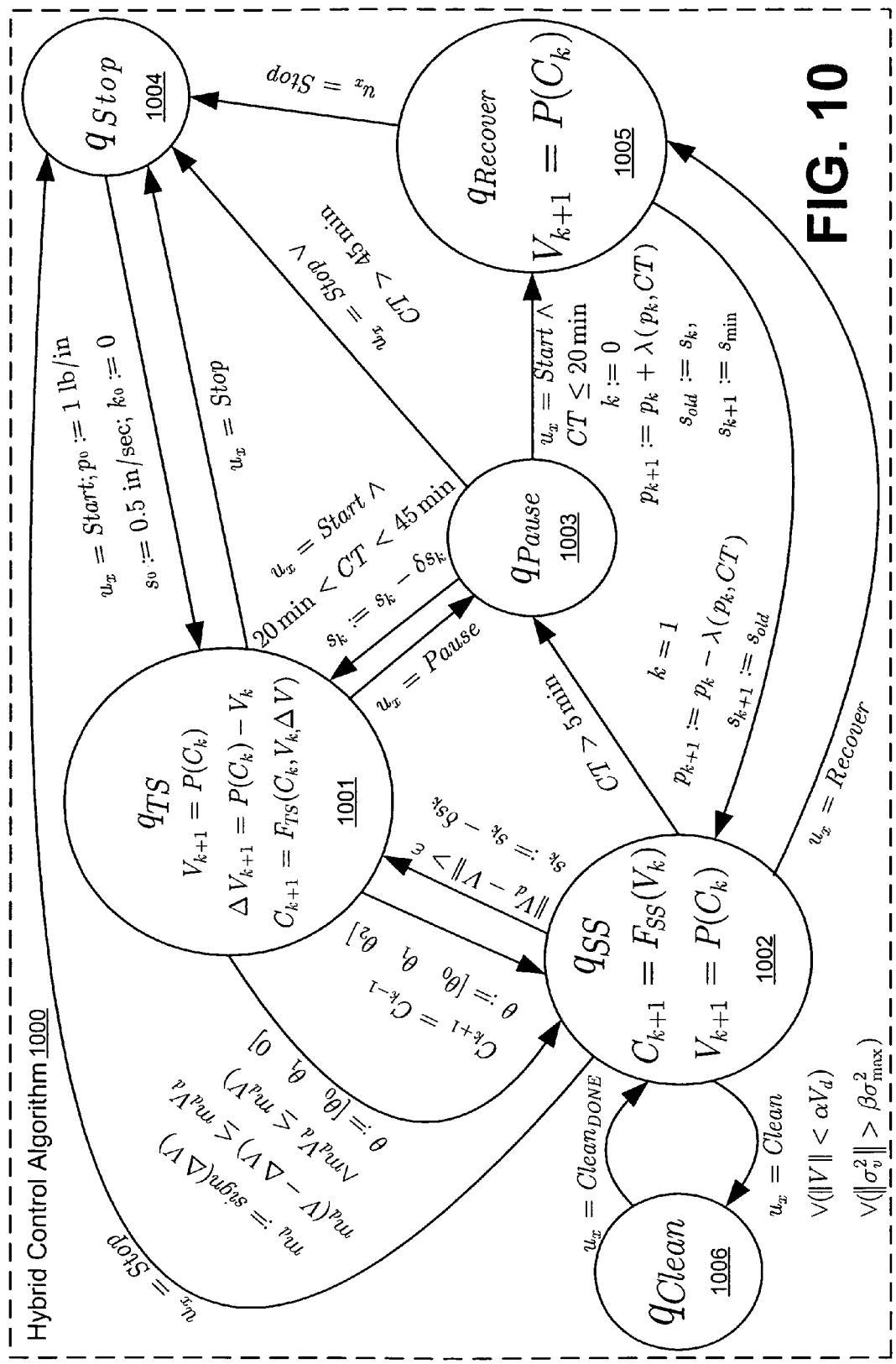
FIG. 10 is a state diagram of an embodiment of the described hybrid control system that may be implemented within the controller of FIGS. 7A and 7B.

Functionality of an embodiment of the hybrid control algorithm 700 executed within controller 610 is presented in the state diagram of FIG. 8. It should be noted that, in some alternative implementations, the functions noted in the various states of this and/or other state diagrams depicted in the accompanying disclosure may occur out of the order depicted. For example, two states shown in succession in FIG. 8 may be performed concurrently, or in some embodiments, certain states may not be needed. Another embodiment of hybrid control algorithm 700 is depicted in FIGS. 9 and 10, but before describing in detail the state diagrams of FIGS. 8–10, the environment of the control problem is further described.

The inherent variability of the process, including measurement inaccuracies, presents a problem of effectively modeling a control strategy. Even when all input parameters are kept constant, the result may vary substantially. In addition to this difficulty, the cost of rework is high, both in monetary value and manufacturing throughput. Thus, it is desirable that the control strategy converge quickly to a control value which results in PCBs printed within predetermined acceptable operating thresholds that do not require rework of the PCB.

As discussed in relation to FIG. 3, and by example in FIGS. 4A and 4B, the height of a solder paste deposit can be adjusted based on the speed of the squeegee if the pressure of the squeegee is constant. General recommendations are that the printing speed should be around one to two in/sec and that the squeegee pressure should be about one lb/in of linear squeegee length.

Notably, the exemplary embodiment described herein varies the speed while maintaining a constant squeegee pressure for simplicity. However, as described above, the controller may be configured to adjust other parameters, such as the squeegee pressure, to control the stencil printing process. Additionally, multiple control parameters may be varied at the same time. For instance, squeegee speed and pressure may both be varied.

These speed and pressure values can manually be adjusted by process engineers, but this method relies on heuristics or experience. That is, an operator or engineer learns via trial and error how the machine performs in relation to a variety of problems without a mathematical or logical approach. From this experience, the operators and engineers may adjust various stencil printer controls in an effort to obtain a solder paste deposit closest to a desired volume. However, using a hybrid, data-driven, closed-loop control algorithm, an automated process may be implemented which provides several advantages.

The process under consideration can be characterized as follows. When the $n^{th}$ board is printed, this is a realization of Q Random Variables (RV) of unknown probability density function (PDF), where Q is the total number of component pads on the board. The main problem is that additional samples of the same RV's cannot be obtained in a strict sense. When a new board is printed and then measured, a new set of samples is created; these cannot be considered as subsequent sample realizations of Q RVs associated with the $n^{th}$ board because of the following reasons. First, the n+1 board produced is printed in an opposite direction and it has been shown from experimental data that this fact can cause a discrepancy greater than 10% in the volume of the solder paste that is deposited. Second, the n+2 board is different from the $n^{th}$ board by the effects of the printing of the n+1 board; therefore, the printing of the n+2 board does not match either the printing conditions or the measured volume of the solder paste that was deposited in the $n^{th}$ board.

A simpler and better approximation is to consider the measurements of the solder paste deposits of the same component type as multiple sample realizations of the same RV. This approximation is valid because the conditions that were present for all solder paste deposits printed on the same board are practically the same, even when their locations are different. Therefore, some other factors such as pad orientation, density, location, and type should be considered. In addition, by the Central Limit Theorem, it can be assumed that if the number of measurements (from RVs with unknown PDF) is large enough for a specific component pad type, then the sample PDF obtained will be approximately Gaussian.

Now, a mathematically rigorous approach can be established to analyze the problem. Let the example be measuring the height of a solder paste deposit on the $n^{th}$ board. Let Q be the number of pads on the $n^{th}$ board and $z(n,i)$ be the measured value of the height of the solder paste deposit on pad i of the $n^{th}$ board. The goal is to have the heights of the solder paste deposits be as close as possible to a desired height denoted by $H_d$. The Mean Square Error (MSE) between the height H(n) and the desired height $H_d$ for the $n^{th}$ board is given by:

$$MSE(n) = E[(Hn) - H_d]^2 \qquad (Eq.\ 3)$$

$$MSE(n) = \underbrace{Var(H(n))}_{AC\ ErrorTerm} + \underbrace{(E[H(n)] - H_d)^2}_{DC\ ErrorTerm}. \qquad (Eq.\ 4)$$

Equation (4) shows that in order to minimize the MSE, it is necessary to minimize the variance, and also the error term, between the expected value of the heights of the $n^{th}$ board E[H(n)] and the desired height.

The sample mean square error of the $n^{th}$ board, denoted by SMSE(n), is given by:

$$SMSE(n) = \frac{1}{Q}\sum_{i=1}^{Q} (z(n,i) - H_d)^2. \qquad (Eq.\ 5)$$

Note that if $z(n,i)=H_d$ for all i, then SMSE(n)=0. Unfortunately, due to process and measurement noise, this idealized case is not applicable. The problem is to select the machine control variables to minimize SMSE(n). To pursue this, SMSE(n) can be expressed as:

$$SMSE(n) = \frac{1}{Q}\sum_{i=1}^{Q}\left(z(n,i) - SM(n)\right)^2 + \left[\frac{1}{Q}\sum_{i=1}^{Q} z(n,i) - H_d\right]^2 \qquad (Eq.\ 6)$$

where SM(n) is the sample mean of the solder paste deposit heights for the $n^{th}$ board and it is given by:

$$SM(n) = \frac{1}{Q}\sum_{i=1}^{Q} z(n,i), \qquad (Eq.\ 7)$$

and the sample variance of the solder paste deposit heights for the $n^{th}$ board is given by:

$$SV(n) = \frac{1}{Q-1}\sum_{i=1}^{Q} (z(n,i) - SM(n))^2. \qquad (Eq.\ 8)$$

Note that the first term in equation (6) is approximately the sample variance of H(n) given in equation (8). Rearranging coefficients in equation (7) and (8) the SMSE(n) can be expressed as:

$$SMSE(n) = \frac{Q-1}{Q}SV(n) + (SM(n) - H_d)^2. \qquad (Eq.\ 9)$$

Actually, for large values of Q the term $(Q-1)/Q \approx 1$. That is in fact an analogous result to the case when the true mean and variance are used rather than the sampled ones. The SMSE(n) error term should be combined with the error associated with the sample variance and mean for a specific number of measurements.

The problem of minimizing SMSE(n) can be approached in a sub-optimal way by minimizing the second term in the expression for SMSE(n), that is, by reducing the difference between SM(n) and Hd. Due to the nature of the process, in order to minimize the variance term, for a nominal pressure of 1 lb/in (0.113 kg/m), it is enough to maintain the squeegee speed as low as possible. Initially, if the difference between SM(n) and $H_d$ is greater than some positive threshold, then a machine control variable is changed by a predetermined amount to decrease the difference between SM(n) and $H_d$. If the difference between SM(n) and $H_d$ is less than some negative threshold, then a machine control variable is also changed to decrease the difference between SM(n) and $H_d$.

The effect of control variable changes on the first term in SMSE(n) can be computed and can be taken into account in determining appropriate settings for the machine control variables. Additional constraints are added to the previous algorithm to be able to meet the requirements of the process, specifically, the maximum and minimum values of all samples z(n,i).

In practical terms, a larger weight may be given to small, fine-pitch or problematic contact pads so a deviation from its nominal value is heavily penalized. For this it is necessary to include the definitions of weighed (W) sample mean, variance, and MSE. These may be defined respectively as:

$$SM_W(n) = \frac{1}{Q}\sum_{i=1}^{Q} w_i z(n, i) \quad \text{(Eq. 10)}$$

$$SV_W(n) = \frac{1}{Q-1}\sum_{i=1}^{Q} w_i(z(n, i) - SM(n))^2 \quad \text{(Eq. 11)}$$

$$SMSE_W(n) = \frac{Q-1}{Q}SV_W(n) + (SM_W(n) - H_d)^2. \quad \text{(Eq. 12)}$$

Furthermore, the sample variance of the sample mean $\sigma^2_{SM}$ (n) will be determined by the number of samples used to calculate SM(n). This is proved as follows:

$$\sigma^2_{SM(n)} = \frac{1}{Q^2}\sum_{n=1}^{Q} \sigma^2(n) \quad \text{(Eq. 13)}$$

$$E[SV(n)] = \sigma^2(n) \quad \text{(Eq. 14)}$$

If:

$$\sigma^2(n) \approx \sigma^2 \text{ for all } n \quad \text{(Eq. 15)}$$

then, $$\sigma^2_{SM} = \frac{\sigma^2}{Q}. \quad \text{(Eq. 16)}$$

Equation (16) implies that if the variance of the height measurements for each board is approximately 0.4 mils (10.16 μm), then the expected variation of the sample mean over several boards will be that value divided by the number of measurements taken from that board. This demonstrates that not even in the ideal case, with uncorrelated samples, will the variation of the process be zero. However, this is assuming that all of the heights of the solder paste deposits are independent from each other; in reality, this is not true because they were printed on the same machine and with the same squeegees; thus some characteristics of the solder paste are quite similar from one board to the other.

Based on experimental results, it is observed that the sample mean variation is bounded by its mean plus and minus half of the sample variance of an individual board. This means that for the 0.4 mils (10.161 μm) board variance case, the mean will be confined to the interval ±0.2 mils (±5.08 μm) from the mean of over all boards.

Now consider a process governed by the control action C with measurements y of quality characteristics of the process given by:

$$y = F(C) + v. \quad \text{(Eq. 17)}$$

where F is an unknown function of the control variable C, and v is the process and measurement noise. The control variable C can be thought of as a machine setting, and it is assumed that C can take on any value in the interval [$C_{min}$, $C_{max}$]. The actual input of the control variables are determined by the physical limitations of the equipment.

Given some desired value height value $H_d$ for the quality characteristics, the objective is to determine a control value $C_d$ such that $\|F(C_d)-H_d\|$ is suitably small. That is, the object is to use a control value such that a board having solder paste deposited using the control settings will achieve a median height of solder paste deposits close to the desired height. As discussed previously, the value of the control variable C (the machine setting) is determined by the equipment operator or process engineer using past experience obtained from running the process. However, this procedure does not guarantee that the chosen value of C will be a "good value," or that the chosen value of C will always work while the process is in operation. In order to achieve a robust and effective performance, one obvious solution would be to generate feedback control laws of the form C=G(y) for some function G, such that $\|F(G(y))-H_d\|$ is suitably small during process operation. Unfortunately, the function F cannot be determined from a simple first-principles analysis. That is, because of inherent process and measurement noise, the result of the control input can not be accurately predicted using simple mathematical models derived from known process parameters. Another complication is that any type of system identification approach relies on sufficient system excitation, i.e. either a large number of measurements are made or large changes in the control variables. In the stencil printing process application, each measurement corresponds to the printing of a board, with a prohibitive cost and time investment associated with it. Thus, only a limited number of measurements are available for determining the control law.

Accordingly, the following control algorithm attributes for a stencil printing process are desired: minimize the number of function evaluations; produce adequate values for the control variable at all times (e.g. an adequate control value is defined as one that, on average, over time produces process outputs that are between the process limits); find and maintain an appropriate operational point for the process; avoid exciting higher order modes in the system by limiting the magnitude of the maximum step size; reduce defects; improve process quality by controlling solder paste volume deposition; and compensate for the performance differences induced by alternating print directions.

Thus, two obstacles are needed to address the particular stencil printing process nuances. The first involves driving the system to achieve an acceptable process in as few steps as possible, and the second involves keeping the process in this region. Therefore, it is advantageous to decompose the control algorithm into two subparts as well, resulting in a switched, or hybrid control algorithm.

Exemplary Hybrid Control Algorithms

FIGS. 8, 9, and 10 represent exemplary closed-loop hybrid control algorithms which may be executed by controller 610. FIG. 8 depicts a basic example of an exemplary state diagram of the hybrid control algorithm, while FIG. 9 and FIG. 10 depict state diagrams of exemplary embodiments having more complex implementations.

Now looking to FIG. 8, the state diagram of a closed-loop hybrid control algorithm 700 which may be executed by controller 610 is depicted. An independent closed-loop hybrid control algorithm 700 may be implemented for each direction, and executed by sub-controllers 614 and 616. The hybrid control algorithm of the stencil printing process is defined by a first, coarse search 702 which converges to an acceptable process in very few steps. Once the coarse search fails to continue producing control values that improve the volume of the printed solder paste deposits, the control algorithm transitions to a more refined estimator 706 which takes smaller steps but produces a more tuned process.

In the present embodiment, a constrained conjugated-gradient descent search is used for the first, coarse search 702 of the control law. Additionally, in the present embodiment, the refined estimator 706 is a least-squares estimator for maintaining and fine tuning the process once an initial process window has been determined from the coarse search. While course search 702 is described below as a gradient search, a variety of fixed or variable step search algorithm may be used. Additionally, the refined search may be implemented by any number of block or recursive estimation algorithms such as, but not limited to, a Robust Non-Linear Least Squares algorithm; wherein the term "Robust" implies that outliers do not greatly affect the slope estimation.

Because a least-squares estimator makes much smaller control adjustments, it is more efficient to switch from the constrained conjugated-gradient search to the least-squares algorithm near the desired operational point. Additionally, when using a least-squares affine estimator it is also preferable to have sufficient, reliable data available for obtaining an initial parameter estimation. For this, an additional transitional stage may be introduced for interfacing the constrained conjugated-gradient descent search with the least-squares affine estimator. This stage is depicted by transition stage 704 in FIG. 8. Transition stage 704 occurs after the coarse search 702, but before refined search 706. In the present embodiment, a windowed-smooth block form of a least-squares squares affine estimator is used as transition stage 704. Thus, after the coarse search 702, here a constrained conjugated-gradient descent search, produces a control value that results in a mean solder paste deposit height that is not improved by the subsequent searches, the hybrid control algorithm switches to transition mode 704 using a block version of a least-squares squares estimator. After W steps, where W is the size of the window in the block version least-squares squares estimator, the algorithm switches to the refined search 706.

Other algorithms, similar to the constrained conjugated-gradient descent search and least-squares squares affine estimator may be used to implement the closed-loop hybrid control strategy discussed herein. The important aspect of the coarse search is that it converges quickly to produce solder paste deposits with a mean height measuring within predetermined process limits. Preferably, for efficiency, the coarse search 702 is continued until it no longer produces control values that result in solder paste deposits with a volume closer to the desired solder paste deposit volume. Said another way, after the course search determines the proper search direction, it continues to adjust the print speed by the predetermined amount until the resulting difference between the mean solder paste deposit height and the desired height is not increased. The hybrid control strategy then switches to either the transition stage 704, or the refined search 706 for maintaining and fine-tuning the process. The windowed, block version of the least-squares estimator used for transition stage 704 may be replaced with other control methods which ensure that the control value is producing results sufficiently close to the desired operational point, and that sufficient reliable data is available for obtaining an initial parameter estimation for the refined search 706.

Turning now to FIG. 9, another exemplary embodiment of a hybrid control algorithm 700 which may be implemented by controller 610 is described. The two states used to generate new control values are shown as gradient-search state 804 and least-squares state 806. In the present embodiment, gradient-search state 804 and least-squares state 806 correspond to coarse search 702 and refined estimator 706 from FIG. 8, respectively. As described above, in some embodiments, transition stage 704 also uses a least-squares algorithm, and thus for the sake of simplicity, transition stage 704 has been incorporated into least-squares state 806. Additionally, in some embodiments, transition mode 704 may not be required. The hybrid control algorithm 700 begins with a stencil printing machine idling at state STOP 802. A transition from state STOP 802 to gradient search state 804 occurs when the stencil printer is preparing to deposit solder paste on the electronic medium. As the controller transitions into the gradient search state 804, the squeegee speed is set to an initial control value $C_0$. The initial control value $C_0$ may be chosen based on a predetermined setting or based on the operator's or engineer's past experience. For example, a $C_0$ of 0.5 in/sec may be used. Without past operational data, and because of the inherent variance of the process, it is understood that this initial value may often produce solder deposits with the mean height outside of the desired predetermined process limits.

Once the stencil printer is started the controller transitions to gradient-search state 804 to obtain a locally optimal control value C. That is, referring back to FIG. 6, solder paste deposits are printed on PCB using stencil printer 502, and after being measured by inspection equipment 504, the results are fed into feedback controller 512. Feedback controller 512 includes controller 610 which implements hybrid control algorithm 700 (FIG. 8). The coarse, gradient search 804 of hybrid control algorithm 700 determines a new control value. The gradient search is repeated until the search no longer produces a control value that results in solder deposits with a mean height closer to the desired solder paste deposit height. The gradient search could be stopped sooner, such as when the search first produces a mean solder deposit height within predetermined process limits. However, the process is more efficient by continuing the gradient search until the search no longer produces a control value that results in solder deposits with a mean height closer to the desired solder paste deposit height.

Once the optimal control value from gradient search state 804 is obtained, a transition occurs to least-squares state 806, at which point a reset initializes the least-squares parameters. Again, the process now continues using finer adjustments obtained from the least-squares approach. Should the performance of the least-squares algorithm deteriorate, the process may switch back to the gradient-search state 804 where a new gradient search is again iteratively conducted as described above. The above described deterioration may be indicated by process drift outside of a predetermined acceptable operational band. Note that process drift is determined by calculating the difference in mean height of a printed PCB to a desired height, and comparing this difference to predetermined acceptable limits.

If the performance of the least-squares estimator used in least-squares state 806 produces solder paste deposits with a mean height outside of an even larger threshold, or perhaps by other indicators, this is an indication that the stencil should be manually wiped and the controller transitions from least-squares state 806 to wipe state 810. Once the stencil is manually wiped, the controller transitions back into least-squares state 806 for calculating the new control value. For example, a stencil may accumulate debris or other physical obstructions on the surface which cause the results of the printing process to stray. By simply wiping the stencil, the controller may return to the precise control given by the least-squares state 806 without transitioning back to the gradient-search state 804.

While hybrid control algorithm 700 is in the least-squares state 806, the PAUSE state 808 is entered if the process cycle time exceeds a pre-determined amount of time. For instance, transition to the PAUSE state 808 may occur if no PCBs are processed within a time window of five minutes. If, after the PAUSE state 808 is entered, the stencil printer is restarted within a second pre-determined amount of time (e.g. 20 minutes), no new gradient search is needed and the controller transitions back to least-squares state 806. However, if the stencil printer has idled for more than the second pre-determined amount of time, but less than a third pre-determined amount of time (e.g. 45 minutes), the controller transitions back to gradient-search state 804 and a new gradient search is performed using the last known good control value. Should the stencil printer stay in pause mode 808 for more than the third pre-determined amount of time, the controller transitions back into STOP state 802 and a subsequent PCB will be run with a new initial control value $C_0$. The states used in addition to the gradient-search state 804 and the least-squares state 806 (e.g. WIPE 810, PAUSE 808, and STOP 802) are used to capture the complex nature of the process, and in order to be able to adapt to external events affecting the process.

A more detailed discussion of the constrained conjugated-gradient descent search and the least-squares estimator used is now presented.

The Coarse Control Algorithm

The proposed gradient search 804 of the hybrid control algorithm 700 is based on a quantization of the control values, i.e. C will only take on values in the set $S(C_0, A)$, where $$S(C_0, \Delta) = \{C \in [C_{min}, C_{max}] | C = C_0 + k\Delta \text{ for some } k \in \mathbb{Z}\}. \quad \text{(Eq. 18)}$$

The gradient search should generate a control value $C^* \in S(C_0, \Delta)$ such that $$|F(C^*) - H_d| \leq |F(C) - H_d|, \forall C \in S(C_0, \Delta). \quad \text{(Eq. 19)}$$

In general, $C^*$ is not equal to $C_d$. In fact, $C^*$ belongs to a discrete set of equally spaced control values and it will minimize the steady-state error for that given set only, while $C_d$ is a root of $F(C)$ that provides the desired average output value $H_d$ for a zero-mean noise.

It is assumed that F in equation (17) is continuously differentiable and monotonically increasing or decreasing on $[C_{min}, C_{max}]$. i.e. $C \in [C_{min}, C_{max}]$ such that $$sign\left(\frac{dF(C_1)}{dC}\right) = sign\left(\frac{dF(C_2)}{dC}\right) \neq 0, \quad \text{(Eq. 20)}$$

$$\forall C_1, C_2 \in [C_{min}, C_{max}].$$

A further assumption is that the noise term v is bounded over the interval $[-a, a]$, which implies that if F is monotone, then the only fundamental entity that our control algorithm needs to recover is the search direction, which is the sign of the slope of F. However, this should be achieved in the presence of the noise term v. For this, A is used to denote the step-size in the algorithm, and $\Delta$ as well as the initial control value $C_0 \in [C_{min} + \Delta, C_{max} - \Delta]$ are chosen such that $$F(C_0) \notin [F(C_0 + \Delta) - 2a, F(C_0 + \Delta) + 2a] \quad \text{(Eq. 21)}$$

$$\bigcup [F(C_0 + \Delta) - 2a, F(C_0 + \Delta) + 2a]$$

$$\bigcup [Hd - 2a, Hd + 2a].$$

The interpretation here is that the gradient search should use initial control values providing enough separation to be able to recover the slope of F when starting the iterative control process suitably far away from the desired operating point. Furthermore, $\delta_0$ is defined as $$\delta_0 = H_d - y(C_0), \quad \text{(Eq. 22)}$$

where y(C) is used as shorthand for $F(C)+v$ in equation (17).

The assumption that the noise is bounded in $[-a, a]$ is based on the physical nature of the process; the specific value of a can be found by calculating the maximum and minimum values of the sampled mean process over an extended period of time.

Thus, in order to achieve the desired operational point, a weak-search algorithm based on a conjugated gradient scheme may be used. A weak-search algorithm does not make strong assumptions about the nature of the process. For example, the mean variance, autocorrelation function, or any other parameters related to the signal are considered unknowns. Pseudocode for the proposed algorithm can be described as follows:

Let $C_0$ and $\Delta$ satisfy equation (21) and let $\delta_0$ be given in equation (22).

Set $C_1 = C_0 + \text{sign}(\delta_0)\Delta$      (Alg. 23)

Set $m_1 = \text{sign}(y(C_1) - y(C_0)) - \text{sign}(C_1 - C_0)$

Set $i = 1$

While $\|y(C_{i-1}) - H_d\| > \|y(C_i) - H_d\|$

Set $\delta_i = H_d - y(C_i)$

Set $C_{i+1} = C_i + m_i\text{sign}(\delta_i)\Delta$

Set $m_{i+1} = \text{sign}(y(C_{i+1}) - y(C_i))\text{sign}(C_{i+1} - C_i)$

Set $i = i + 1$

End

Set $C^* - C_{i-1}$.

According to algorithm (23), the control value is incrementally adjusted by a predetermined amount $\Delta$. Whether the incremented adjustments are positive or negative depends on the slope m, and the increment continues until the updated control value no longer produces a mean solder paste deposit height closer to the desired height. Preferably, for efficiency, the coarse search is continued until it no longer produces control values that result in solder deposits with a volume closer to the desired solder paste deposit volume. Due to the monotonicity of F, Algorithm (23) will in fact terminate, and as long as there exists enough separation around the final control value, i.e., that $$F(C_0) \notin [F(C^* + \Delta) - 2a, F(C^* + \Delta) + 2a]$$
$$\bigcup [F(C + \Delta) - 2a, F(C^* + \Delta) + 2a] \quad \text{(Eq. 24)}$$
$$C^* \in [C_{min} + \Delta, C_{max} - \Delta]$$

then algorithm (23) recovers the optimal control value in equation (19). Furthermore, since the first step of the algorithm consists of guessing the slope (setting $m_0=1$), maximally two steps (a wrong initial guess and a recovery step) are wasted. Another step will be used for overshooting the desired value, which is needed for terminating the process, and thus the following proposition can be stated:

Proposition 1: Assume F satisfies equation (20), and that there exists (not necessarily uniquely) an integer k* such that $C_0+k^* \Delta \in S(C_0, \Delta)$ solves equation (19). Then, algorithm (23) terminates in at most k*+3 steps with the terminating control value $C_0+m\ k^*\ \Delta$ as long as equation (24) is satisfied.

Corollary 1: If there exists a $C_0 \in S(C_0, \Delta)$ such that $F(C) \in [H_d-a, H_d+a]$, then C* in Proposition 1 satisfies $$F(C^*) \in [H_d-a, H_d+a] \quad \text{(Eq. 25)}$$

The bound k*+3 can be reduced to k*+2 if algorithm (23) is modified to let $\|C_2-C_1\|=2\Delta$ if the initial slope-guess was wrong. By doing so, only one step is wasted in the initial portion of the algorithm. Also, the monotonicity assumption can roughly be thought of as a first order approximation of F, and algorithm (23) is in fact general enough to capture second order approximates as well.

Assume that F is continuously differential and unimodal on $[C_{min}, C_{max}]$; i.e., that there exists a unique $C_m \in [C_{min}, C_{max}]$ such that:

$$m_1 = \text{sign}\ (F(C_2)-(F(C_1))=\text{sign}\ (F(C_1)-(F(C_m)))\ \forall C_1,$$
$$\leq C_2 \leq C^m \quad \text{(Eq. 26)}$$

$$m_2 = \text{sign}\ (F(C_3)-(F(C_m))=\text{sign}\ (F(C_4)-(F(C_3)))$$
$$\forall C_m \leq C_3 \leq C_4 \quad \text{(Eq. 27)}$$

$$m_1 = -m_2. \quad \text{(Eq. 28)}$$

Here, $C_i \in [C_{min}, C_{max}]$, i=1, 2, 3, 4 and $C_m$ is the extremum value of F being either the maximum or minimum value depending on the concavity of the function. It is assumed that the initial control value $C_0$ and step-size $\Delta$ not only satisfy equation (22), but also that $F(C_0)$ is far enough from the extremum, i.e., that $$\text{sign}(F(C_0+\Delta)-F(C_0))=\text{sign}(F(C_0-\Delta)-F(C_0)). \quad \text{(Eq. 29)}$$

Under these assumptions, Algorithm (23) can be directly applied to the unimodal case as well, since on each side of the extremum, if it exists, F is monotone.

Proposition 2: Assume that F satisfies equation (26), (27), and (28), and that there exists (not necessarily uniquely) an integer k* such that $C_0+k^*\Delta \in S(C_1, \Delta)$ solves equation (19). Then Algorithm (23) terminates in a finite number of steps to control value $C_0+m\ k^*\Delta$ if ($C_0, \Delta$) satisfies the conditions in equation (29) and equation (24).

Corollary 2: If there exists a $C \in S(C_0, \Delta)$ such that $F(C) \in [H_d-a, H_d+a]$, then C* in Proposition 2 satisfies $$F(C^*) \in [H_d-a, H_d+a]. \quad \text{(Eq. 30)}$$

The Transition and Refined Search

Attention now is directed to the least-squares estimator which may be used to implement transition mode 704 and refined search 706. Taking the final value of Algorithm (23), C*, as the initial control value for the next stage, a local optimization procedure, or refined search, can be performed in order to fine-tune C* such that the steady state error is minimized. For this, a local affine least-squares estimator can be applied to the optimization of the process and perform a fine-tuning of the control variable.

A least squares affine estimator is applied locally (as opposed to the global coarse search) because of the high levels of noise that make LS prohibitive on a global scale without having biased and/or unbounded estimations. Accordingly, an interphasing step may be used, as depicted by transition stage 704 in FIG. 8, in order to ensure that the switching between the coarse gradient search and the refined least-squares affine estimator is non-abrupt. It is preferred to keep the values of at least two final iterations of algorithm (23) to maintain the estimated slope direction in the presence of excessive noise. This is beneficial because noisy measurements can otherwise invert the direction of the slope. In addition, it is beneficial to switch from a block-form of the least squares to a windowed version in order to reduce the computational cost.

As mentioned, the block form of the least-squares estimator may use a number of the final values generated by algorithm (23). After this, the controller may switch from the block-form of the least-squares estimator to a windowed version that also preserves some information about previous estimates. More specifically, if the length of the least-squares window is W, then the $(i-(W+_1))^{th}$ estimated parameter vector $\theta$ is stored and used to maintain the slope of the estimator. The vector $\theta$ is stored and used to maintain the slope of the estimator. The vector $\theta$ is the set of calculated coefficients for the affine or quadratic estimator depending on the process characteristics.

If equation (24) holds, then an affine estimator can be used to determine the next control variable. However, if equation (24) does not hold, i.e., F(C*) cannot generate the desired y, then a quadratic estimator can be used to minimize the steady state error even under such adverse conditions.

Attention now is directed to the least-squares affine estimator as may be used in least-squares state 806. The classic least-squares solution to the over determined problem, $M\theta=y$, is given by:

$$\hat{\theta} = \begin{bmatrix} \hat{\theta}_0 \\ \hat{\theta}_1 \end{bmatrix} = (M^T M)^{-1} M^T z. \quad \text{(Eq. 31)}$$

For an affine estimator, when N samples are available, a closed-form solution can be found. Using the standard basis M (which second column can be interpreted as a discretization of the input domain), the affine estimator is given by $$M = [b \mid \gamma] \text{ where } \gamma = \begin{bmatrix} \gamma^1 \\ \gamma^2 \\ \vdots \\ \gamma^N \end{bmatrix} \text{ and } b = \begin{bmatrix} 1 \\ 1 \\ \vdots \\ 1 \end{bmatrix} N, \quad \text{(Eq. 32)}$$

then the affine estimator may be obtained by:

$$\hat{\theta} = \begin{bmatrix} \hat{\theta}_0 \\ \hat{\theta}_1 \end{bmatrix} = \left( \begin{bmatrix} b^T \\ \gamma^T \end{bmatrix} [b \mid \gamma] \right)^{-1} \begin{bmatrix} b^T \\ \gamma^T \end{bmatrix} y, \quad \text{(Eq. 33)}$$

$$\hat{\theta} = \begin{pmatrix} b^T b & b^T \gamma \\ b^T \gamma & \gamma^T \gamma \end{pmatrix}^{-1} \begin{bmatrix} b^T \\ \gamma^T \end{bmatrix} y, \quad \text{(Eq. 34)}$$

$$\hat{\theta} = \frac{\begin{pmatrix} \gamma^T \gamma & -b^T \gamma \\ -b^T \gamma & N \end{pmatrix}}{N \gamma^T \gamma - (b^T \gamma)^2} \begin{bmatrix} b^T \\ \gamma^T \end{bmatrix} y, \quad \text{(Eq. 35)}$$

$$\hat{\theta} = \frac{\gamma^T \left[ \left( \frac{\gamma b^T - \gamma^T b \mathbb{1}_N}{N \mathbb{1}_N - b b^T} \right) \otimes y \right]}{\gamma^T (N \mathbb{1}_N - b b^T) \gamma}, \quad \text{(Eq. 36)}$$

where $1_N$ is the N×N matrix. All terms needed to calculate $\hat{\theta}$ (except for the measurement y) can be pre-computed for any given number of samples N and a determined set of control values γ obtained by collecting the last N control values. Finally, once $\hat{\theta}$ has been estimated using the measurements y, it is possible to use equation (37) to calculate the next control value $\gamma_{N+1}$ necessary to achieve the desired output $H_d$.

$$H_d = \theta_0 b + \theta_1 \gamma_{N+1}. \quad \text{(Eq. 37)}$$

This also gives an estimation of the noise component of the measurements $\hat{u} = y - \hat{y}$. The expanded expression for the noise in terms of the control values and the measurements is given by $$v = y - \frac{[\gamma^T(N \mathbb{1}_N - bb^T)y]\gamma + [\gamma^T(\gamma b^T - b^T \gamma \mathbb{1}_N)y]b}{[\gamma^T(N \mathbb{1}_N - bb^T)\gamma]}. \quad \text{(Eq. 38)}$$

Now, an estimate of the mean and variance can be obtained by the sample mean and sample variance of the noise; these statistics can be expressed as $$\hat{V} = [\hat{v}1 \quad \hat{v}2 \quad \ldots \quad \hat{v}N]^T \quad \text{(Eq. 39)}$$

$$\mu_{\hat{v}} = \frac{1}{N} b^T \hat{V} \quad \text{(Eq. 40)}$$

$$\sigma_{\hat{v}}^2 = \frac{1}{N-1} (\hat{V} - b\mu_{\hat{v}})^T (\hat{V} - b\mu_{\hat{v}}). \quad \text{(Eq. 41)}$$

If equation (24) does not hold, quadratic regression may be used instead of affine regression with success. That is, the affine estimator is applicable when the desired height is achievable given the range of variation of the control value and its effect on the height. However, if an unrealistic value for the desired height is specified, then a quadratic estimator may be used to provide the solution that minimizes the error even when the target operational point is not obtainable.

The following process, using quadratic regression, is an extension of the affine regression discussed above. The parameter estimation can be done either by direct matrix inversion as in eq. 33, or by QR decomposition as described below. Specifically, if Q and R correspond to the QR decomposition of M; in this case M is given by $$M = [\gamma^0 \mid \gamma^1 \mid \gamma^2] \quad \text{(Eq. 42)}$$

where $$\gamma^n = \begin{bmatrix} \gamma_1^n \\ \gamma_2^n \\ \vdots \\ \gamma_N^n \end{bmatrix} \quad \text{(Eq. 43)}$$

is the $n^{th}$ Hadamard product of γ by itself. Then $$\hat{\theta} = \begin{bmatrix} \hat{\theta}_0 \\ \hat{\theta}_1 \\ \hat{\theta}_2 \end{bmatrix} = R^{-1} Q^T y. \quad \text{(Eq. 44)}$$

Notice that the inverse of R is easily calculated by using, for example, row or column back-substitution, because R is an upper-triangular matrix. Once $\hat{\theta}$ is known, then the quadratic estimator of the signal can yield the control value required to produce the closest possible value to the desired height using:

$$H_d = \theta_0 + \theta_1 \gamma_{N+1} + \theta_2 \gamma_{N+1}^2. \quad \text{(Eq. 45)}$$

Accordingly, the difference between the estimated and the actual sample mean height, an estimate of the variance of the process noise can be obtained if it is required. When the local optimization algorithm is running and there are not large changes in the system response, it is not necessary to go back to the global search algorithm and its thresholding. However if the process is restarted, to avoid out-of-bounds control parameters, it is necessary to go back to Algorithm 23 to find the correct operational band.

Now that the exemplary coarse and refined algorithms have been described in more detail, attention is now directed to FIG. 10 which depicts yet another hybrid control algorithm 1000 embodiment. Hybrid control algorithm 1000 may be implemented, for example, within controller 610 of FIG. 7A or 7B.

The following legend identifies the variables used in FIG. 10 and in the associated description below:

$C_k$: Control inputs for the $k^{th}$ PCB, $C_k = \{s_k, p_k\}$
CT: Cycle Time of the stencil printer
$m_d$: Jacobian (gradient slope sign)
P(•): Stencil Printing Process
$p_k$: Squeegee pressure for the $k^{th}$ PCB
$s_k$: Print speed for the $k^{th}$ PCB
$s_{min}$: Minimum print speed
$s_{old}$: Saved print speed
$u_x$: User comand (input variable)

$V_k$: Measure of the Volume for the $k^{th}$ PCB
$V_d$: Desired solder paste volume deposition
$\in$: Maximum allowable volume deviation
$\theta$: Estimator parameters vector, $\theta:=[\theta_0\ \theta_1\ \theta_2, \ldots]$
$\delta$: Control variable change
$\sigma_v^2$: Solder paste volume variance
$\sigma_{max}^2$: Maximum solder paste volume variance
$\lambda(\bullet)$: Pressure adjustment function
$\|X\|$: Norm of the argument $$X, \left(\frac{1}{n}\sum_{i=1}^{n}(X_i)^p\right)^{\frac{1}{p}}, p \in [-\infty, \infty]$$

States 1001–1006 of hybrid control algorithm 1000 are connected by a set of transitions, represented by the arrows connecting states 1001–1006, that are controlled by either user inputs, $u_x$, or by conditions based on values of a number of process variables. Each one of states 1001–1006 may represent a different functional model for the controller, and the states may have either discrete or continuous dynamics. For this specific embodiment only two control variables were used: speed and pressure. The output variable is a nonlinear function of the solder paste deposit volume. The threshold values given for CT are an example for a specific case; however, they can be found by direct experimentation with the stencil printing process quality degradation when subject to cycle time modification.

The following are the basic controller states of the embodiment shown in FIG. 10:

$q_{TS}$: Transient State (Coarse Algorithm) 1001
$q_{SS}$: Steady State (Refined Search) 1002
$q_{Pause}$: Pause State 1003
$q_{Stop}$: Stopped State 1004
$q_{Recover}$: Recover Solder Paste Working Viscosity Point State 1005
$q_{Clean}$: Stencil Cleaning State 1006

Inside each state 1001–1006, as in a standard space-state representation, several internal and external dynamics can be involved. For example, if a function of the solder paste volume that will be deposited during the stencil printing process on the $(k+1)^{th}$ printed circuit board is denoted by $V_{k+1}$, and the stencil printing process is performed by using the previously calculated control parameter $C_k$, then the system dynamics are described by $V_{k+1}=P(C_k)$, where the $P(\bullet)$ denotes the stencil printing process.

A subsequent control value, $C_{k+1}$, may be generated based on previous control values $\{C_k, C_{k-1}, \ldots\}$, previous measurements $\{V_k, V_{k-1}, \ldots\}$, the rate of change of the measurements $$\left\{\frac{\Delta V_i}{\Delta i}, i = k, k-1, k-2, \ldots\right\},$$

and/or external inputs. Given that there is a large difference between the functions that generate the transient (coarse control algorithm) 1001 and the steady state (refined search) 1002 control variables, they have been labeled, $F_{TS}$ and $F_{SS}$, respectively.

As mentioned before, the arrows represent unidirectional state changes, which are triggered by either user commands or process variable conditions. Each transition has at least one condition that is often depicted as a Boolean relationship, i.e., CT>5 minutes, k=1, $u_x$=Start, etc. The symbols "$\wedge$" and "$\vee$", correspond to the standard "AND"/"OR" logical operations. Additionally, after the condition is met and before a transition is performed, some system variables may change value, i.e., s:=s−$\delta$s, p:=1, etc.

Depending on the current state, user commands, $u_x$, can be some of the following: $u_x \in$ {Start, Stop, Recover, Clean, Clean$_{DONE}$}. As shown in FIG. 10, the command Clean$_{DONE}$ occurs automatically after the initial Clean command has been given and completed. The Recover command can be given during the normal steady state mode in order to recover (or avoid losing) the solder paste viscosity point after, for example, a cleaning cycle which exceeds some defined time limit depending on process specific parameters. After a Recover or Stop command, the PCB counter k is reset to zero.

In some cases, there is more than one way to transition from one state to another, for example, two different conditions trigger a transition from state $q_{TS}$ to state $q_{SS}$:

$$\left\{\begin{array}{l} m_d := sign(\Delta V) \\ m_d(V - \Delta V) \leq m_d V_d \\ \wedge\ m_d V_d \leq m_d V \end{array}\right\} \text{ and } \{C_{k+1} = C_{k-1}\}.$$

These conditions produce different estimator coefficients, namely, $\theta:=[\theta_0\ \theta_1\ 0]$ and $\theta:=[\theta_0\ \theta_1\ \theta_2]$, respectively.

CONCLUSION

A system and method of producing closed-loop control values in a stencil printing process has been described. One potential benefit is that the closed-loop hybrid control strategy is able to control the volume of solder paste deposits despite highly variable process conditions. Another potential benefit is that the control strategy uses only a small number of data samples. This hybrid control combines a coarse control algorithm for quickly finding a control value producing solder paste deposits within predetermined process limits, with a more refined estimator for fine tuning the control value. Some potential benefits of the system are the ability to consider and compensate for differences in solder paste deposit volumes in different printing directions, and recover from abnormal equipment set points. Another potential benefit is the ability to control a process defined by a limited set of measurements, constrained control values, and significant amounts of process noise. Such a hybrid control algorithm is well suited for controlling the application of solder paste to a variety of electronic mediums.

While the examples given throughout the specification are specifically described in relation to using the stencil printing process in the manufacture of PCBs, it should be understood that the methods and systems are also well suited for stencil printing applications for any number of electronic mediums. One such alternative electronic medium may be a semiconductor based device, such as but not limited to, semiconductor chips or wafers in the bump packaging process. Additionally, the system may also be used for the application of solder paste, or its equivalent, to bio-materials and bio-components.

It should be emphasized that many variations and modifications may be made to the above-described embodiments. All such modifications and variations are intended to be included herein within the scope of this disclosure and protected by the following claims.

What is claimed is:

1. A closed-loop control method for controlling a stencil printing process comprising:
   providing a measurement indicative of a volume of a solder paste deposit on an electronic medium; and
   determining a value of a stencil printer control parameter based on the volume of the solder paste deposit, the step of determining the value of the stencil printer control parameter further comprising:
      incrementally adjusting the value of the stencil printer control parameter by a predetermined amount; and
      fine tuning the value of the stencil printer control parameter after the measurement indicative of the volume of the solder paste deposit volume is within predetermined process limits.

2. The closed-loop control method of claim 1, wherein the step of providing the measurement indicative of the volume of the solder paste deposit includes:
   estimating the volume of the solder paste deposit based upon a height of the solder paste deposit.

3. The closed-loop control method of claim 1, wherein the step of providing the measurement indicative of the volume of the solder paste deposit includes:
   receiving the volume of the solder paste deposit from a measurement tool;
   receiving the estimated volume of the solder paste deposit from a measurement tool; or
   calculating the volume of the solder paste deposit from a measurement of the solder paste deposit.

4. The closed-loop control method of claim 3, wherein the volume of the solder paste deposit is determined by measuring a height of the solder paste deposit.

5. The closed-loop control method of claim 1, further comprising:
   changing a variable value on a stencil printer that corresponds to the stencil printer control parameter.

6. The closed-loop control method of claim 1, wherein:
   the step of incrementally adjusting the value of the stencil printing control parameter is performed by a gradient search; and
   the step of fine tuning the value of the stencil printing control parameter is performed by using any one of: an affine estimator or a quadratic estimator.

7. The closed-loop control method of claim 1, wherein the stencil printer control parameter is any one of the print speed, the squeegee pressure, the snap off speed, the stroke length, the downstop distance, and the separation distance.

8. The closed-loop control method of claim 1, wherein the stencil printer control parameter is print speed and the method further includes the steps of:
   applying a predetermined pressure to a stencil printer squeegee; and
   printing a second solder paste deposit onto a second electronic medium by passing the squeegee across the stencil at the print speed.

9. The closed-loop control method of claim 1, further comprising:
   comparing a mean volume of solder paste deposits to a desired volume to determine a search direction in which to adjust the value of the stencil printer control parameter.

10. The closed-loop control method of claim 1, wherein the step of determining the value of the stencil printer control parameter further includes:
    determining the value of the stencil printer control parameter in a first squeegee print direction; and
    determining the value of the stencil printer control parameter in a second squeegee print direction, independent of the step of determining the control value in the first squeegee print direction.

11. A system for controlling a volume of a solder-paste deposit comprising:
    a controller for association with a stencil printer operable to:
       receive a measurement indicative of the volume of at least one solder paste deposit on an electronic medium;
       determine a control value of a stencil printer control parameter based on the measurement indicative of the volume of the at least one solder paste deposit;
       incrementally adjust the control value of the stencil printer control parameter by a predetermined amount; and
       fine tune the control value of the stencil printer control parameter after the measurement indicative of the solder paste deposit volume is within predetermined process limits.

12. The system of claim 11, wherein the measurement indicative of the volume of the at least one solder paste deposit is a height of the solder paste deposit, a volume of the solder paste deposit, a mean volume of the solder paste deposit, or an estimated volume of the solder paste deposit.

13. The system of claim 11, further comprising:
    an inspection device for supplying the measurement indicative of the volume of the at least one solder paste deposit to the controller.

14. The system of claim 13, wherein the inspection device is any one of a two-dimensional (2D), two-and-a-half-dimensional (2½D), or a three-dimensional (3D) laser inspection system.

15. The system of claim 13, wherein the inspection device is capable of directly or indirectly measuring the volume of solder paste deposit.

16. The system of claim 11, wherein the stencil printer is configured to receive the control value.

17. The system of claim 11, wherein the controller further comprises:
    a first sub-controller for determining the control value in a first squeegee print direction; and
    a second sub-controller, independent of the first sub-controller, for determining the control value in a second squeegee print direction.

18. The system of claim 17, wherein the second squeegee print direction is opposite of the first squeegee print direction.

19. The system of claim 11, wherein the electronic medium is selected from a printed circuit board, a semiconductor wafer, a semiconductor chip, bio-materials, and a bio-component.

20. The system of claim 11, wherein the controller is configured to:
    incrementally adjust the value of the stencil printing control parameter with a gradient search; and
    fine tune the value of the stencil printing control parameter by using any one of: an affine estimator or a quadratic estimator.

21. The system of claim 11, wherein the control value is any one of the squeegee speed, squeegee pressure, snap off speed, the stroke length, the downstop distance, and the separation distance.

22. A closed-loop control method for controlling a stencil printing process comprising:

setting a first value of a stencil printer control parameter;
taking a measurement indicative of the volume of a solder paste deposit on an electronic medium; and
determining a second value of the stencil printer control parameter based on the measurement indicative of the volume of the solder paste deposit by:
incrementally adjusting the first value of the stencil printer control parameter by a predetermined amount; and
fine tuning the first value of the stencil printer control parameter once the measurement indicative of the volume of the solder paste deposit volume is within predetermined process limits.

23. The closed-loop control method of claim 22, wherein the stencil printer control parameter is any one of the print speed, the squeegee pressure, the snap off speed, the squeegee pressure, the print direction, the stroke length, the downstop distance, and the separation distance.

24. The closed-loop control method of claim 22, wherein the step of fine tuning the value of the stencil printer control parameter further includes:
adjusting the value of the stencil printer control parameter by a smaller amount than the predetermined amount using an estimator selected from an affine estimator and a quadratic estimator.

25. The closed-loop control method of claim 22, wherein the step of incrementally adjusting the value of a stencil printer control parameter by a predetermined amount further includes:
determining the value of the stencil printer control parameter using a gradient search.

26. The closed-loop control method of claim 22, wherein the stencil printer control parameter is squeegee speed and the method further includes the steps of:
applying a predetermined pressure to the squeegee; and
printing a second solder paste deposit onto a second electronic medium by passing the squeegee across the stencil at a speed corresponding to the second value of the stencil printer control parameter.

27. The closed-loop control method of claim 22, wherein the stencil printer control parameter is squeegee pressure and the method further includes the step of:
printing a second solder paste deposit onto a second electronic medium by passing the squeegee across the stencil at a predetermined speed and using a pressure corresponding to the second value of the stencil printer control parameter.

28. The closed-loop control method of claim 22, further comprising:
determining the mean height of the solder paste deposit and at least one other solder paste deposit on the electronic medium; and
comparing the mean height to a desired height to determine a search direction in which to adjust the value of the second stencil printer control parameter.

29. The closed-loop control method of claim 22, wherein the step of determining a second value of the stencil printer control parameter is based on a measurement of the volume, an estimated volume, or a height the solder paste deposit.

30. A closed-loop control method comprising:
providing a measurement indicative of a volume of a solder paste deposit on an electronic medium; and
determining a value of a control parameter based on the volume of the solder paste deposit, the control parameter for controlling the application of another solder paste deposit, the step of determining a value of the control parameter further comprising:
incrementally adjusting the value of the control parameter by a predetermined amount; and
fine tuning the value of the control parameter after the measurement indicative of the volume of the solder paste deposit volume is within predetermined process limits.

31. The closed-loop control method of claim 30, wherein the step of providing the measurement indicative of the volume of the solder paste deposit includes:
estimating the volume of the solder paste deposit based upon a height of the solder paste deposit.

32. The closed-loop control method of claim 30, wherein the step of providing the measurement indicative of the volume of the solder paste deposit includes:
receiving the volume of the solder paste deposit from a measurement tool;
receiving the estimated volume of the solder paste deposit from a measurement tool; or
calculating the volume of the solder paste deposit from a measurement of the solder paste deposit.

33. The closed-loop control method of claim 32, wherein the volume of the solder paste deposit is determined by measuring a height of the solder paste deposit.

34. The closed-loop control method of claim 30, wherein:
the step of incrementally adjusting the value of the control parameter is performed by a gradient search; and
the step of fine tuning the value of the control parameter is performed by using any one of: an affine estimator or a quadratic estimator.

35. The closed-loop control method of claim 30, further comprising:
comparing a mean volume of solder paste deposits to a desired volume to determine a search direction in which to adjust the value of the control parameter.

36. A closed-loop control system comprising:
means for providing a measurement indicative of a volume of a solder paste deposit on an electronic medium; and
means for determining a value of a control parameter based on the volume of the solder paste deposit, the control parameter for controlling the application of another solder paste deposit;
means for incrementally adjusting the value of the control parameter by a predetermined amount; and
means for fine tuning the value of the control parameter after the measurement indicative of the volume of the solder paste deposit volume is within predetermined process limits.

37. The closed-loop control system of claim 36, further comprising:
means for estimating the volume of the solder paste deposit based upon a height of the solder paste deposit.

38. A closed-loop control method for controlling a stencil printing process comprising:
providing a measurement indicative of a volume of a solder paste deposit on an electronic medium; and
determining a value of a stencil printer control parameter based on the volume of the solder paste deposit, the step of determining the value of the stencil printer control parameter further including:
determining the value of the stencil printer control parameter in a first squeegee print direction; and
determining the value of the stencil printer control parameter in a second squeegee print direction, independent of the step of determining the control value in the first squeegee print direction.

39. The closed-loop control method of claim 38, wherein the second squeegee print direction is opposite of the first squeegee print direction.

40. The closed-loop control method of claim 38, wherein the step of providing the measurement indicative of the volume of the solder paste deposit includes:
estimating the volume of the solder paste deposit based upon a height of the solder paste deposit.

41. A system for controlling a volume of a solder-paste deposit comprising:
a controller for association with a stencil printer operable to:
receive a measurement indicative of the volume of at least one solder paste deposit on an electronic medium;
determine a control value of a stencil printer control parameter based on the measurement indicative of the volume of the at least one solder paste deposit, the controller further comprising:
a first sub-controller for determining the control value in a first squeegee print direction; and
a second sub-controller, independent of the first sub-controller, for determining the control value in a second squeegee print direction.

42. The system of claim 41, wherein the measurement indicative of the volume of the at least one solder paste deposit is a height of the solder paste deposit, a volume of the solder paste deposit, a mean volume of the solder paste deposit, or an estimated volume of the solder paste deposit.

43. The system of claim 41, wherein the second squeegee print direction is opposite of the first squeegee print direction.

* * * * *